United States Patent
Brezoczky et al.

(10) Patent No.: US 12,548,743 B2
(45) Date of Patent: Feb. 10, 2026

(54) PASSIVE LIFT PIN ASSEMBLY

(71) Applicant: Applied Materials, Inc., Santa Clara, CA (US)

(72) Inventors: Thomas Brezoczky, Los Gatos, CA (US); Kirankumar Neelasandra Savandaiah, Bangalore (IN); Srinivasan Manivannan, Tamilnadu (IN); Arun Rengaraj, Nexus @ One-North (SG)

(73) Assignee: Applied Materials, Inc., Santa Clara, CA (US)

( * ) Notice: Subject to any disclaimer, the term of this patent is extended or adjusted under 35 U.S.C. 154(b) by 270 days.

(21) Appl. No.: 18/241,840

(22) Filed: Sep. 1, 2023

(65) Prior Publication Data

US 2025/0079137 A1     Mar. 6, 2025

(51) Int. Cl.
*H01J 37/32* (2006.01)
*H01L 21/687* (2006.01)

(52) U.S. Cl.
CPC .. *H01J 37/32715* (2013.01); *H01L 21/68742* (2013.01); *H01J 2237/20235* (2013.01); *H01J 2237/3321* (2013.01)

(58) Field of Classification Search
CPC ............. H01L 21/68742; H01L 21/6875
USPC .......................... 269/54.5, 54.4, 53
See application file for complete search history.

(56) References Cited

U.S. PATENT DOCUMENTS

| | | |
|---|---|---|
| 5,180,048 A | 1/1993 | Kawada et al. |
| 5,569,350 A | 10/1996 | Osada et al. |
| 5,641,054 A | 6/1997 | Mori et al. |
| 6,120,609 A * | 9/2000 | Selyutin ............ H01L 21/68792 |
| | | 118/500 |
| 6,157,106 A | 12/2000 | Tietz et al. |
| 6,206,176 B1 | 3/2001 | Blonigan et al. |
| | (Continued) | |

FOREIGN PATENT DOCUMENTS

| | | |
|---|---|---|
| CN | 101158852 A | 4/2008 |
| CN | 113707585 A | 11/2021 |
| | (Continued) | |

OTHER PUBLICATIONS

U.S. Appl. No. 18/081,493, filed Dec. 14, 2022.

(Continued)

*Primary Examiner* — Christopher M Koehler
(74) *Attorney, Agent, or Firm* — Patterson + Sheridan, LLP

(57) ABSTRACT

A substrate support assembly includes a substrate support that is moveable between a raised position, a lowered position below the raised position, and an intermediate position between the raised and lowered positions. A lift pin is disposed in a hole through the substrate support, and is movable vertically with respect to the substrate support. In use, the substrate support assembly transitions between first and second configurations. In the first configuration, the substrate support and the lift pin are coupled such that the lift pin and the substrate support move simultaneously while the substrate support moves between the lowered position and the intermediate position. In the second configuration, the substrate support and the lift pin are decoupled such that the lift pin remains stationary while the substrate support moves between the intermediate position and the raised position.

20 Claims, 10 Drawing Sheets

(56) References Cited

U.S. PATENT DOCUMENTS

| | | |
|---|---|---|
| 6,231,716 B1 | 5/2001 | White et al. |
| 7,293,950 B2 | 11/2007 | Bonora et al. |
| 7,438,175 B2 | 10/2008 | White et al. |
| 7,841,820 B2 | 11/2010 | Bonora et al. |
| 7,948,122 B2 | 5/2011 | Compter et al. |
| 7,964,038 B2 | 6/2011 | Patalay et al. |
| 7,994,486 B2 | 8/2011 | Smick et al. |
| 8,104,951 B2 | 1/2012 | Aderhold et al. |
| 8,851,817 B2 | 10/2014 | Bonora et al. |
| 9,390,950 B2 | 7/2016 | Sorabji et al. |
| 9,588,443 B2 | 3/2017 | Shibazaki |
| 9,964,863 B1 | 5/2018 | Babayan et al. |
| 10,204,810 B2 | 2/2019 | Hoey et al. |
| 10,236,197 B2 | 3/2019 | Janakiraman et al. |
| 10,256,124 B2 | 4/2019 | Mooring |
| 10,262,887 B2 | 4/2019 | Hao et al. |
| 10,283,397 B2 | 5/2019 | Willwerth et al. |
| 10,460,977 B2 | 10/2019 | Breninger et al. |
| 10,483,141 B2 | 11/2019 | Janakiraman et al. |
| 10,490,436 B2 | 11/2019 | Ghosh et al. |
| 10,734,265 B2 | 8/2020 | Janakiraman et al. |
| 10,770,337 B2 | 9/2020 | Lee et al. |
| 10,784,142 B2 | 9/2020 | Marcelynas et al. |
| 10,851,453 B2 | 12/2020 | Tsai et al. |
| 10,892,180 B2 | 1/2021 | Chia et al. |
| 11,232,965 B2 | 1/2022 | Newman et al. |
| 11,377,310 B2 | 7/2022 | Aust et al. |
| 11,508,595 B2 | 11/2022 | Aust et al. |
| 11,527,424 B2 | 12/2022 | Berger et al. |
| 2002/0108842 A1 | 8/2002 | Bonora et al. |
| 2003/0178145 A1 | 9/2003 | Anderson et al. |
| 2003/0219977 A1 | 11/2003 | Pomarede et al. |
| 2004/0023495 A1 | 2/2004 | Butterfield et al. |
| 2004/0058293 A1 | 3/2004 | Nguyen et al. |
| 2004/0112890 A1* | 6/2004 | Kusuda ............... H05B 3/0047 219/520 |
| 2004/0255442 A1 | 12/2004 | McDiarmid et al. |
| 2006/0102078 A1 | 5/2006 | Fairbairn et al. |
| 2006/0156981 A1 | 7/2006 | Fondurulia et al. |
| 2007/0160507 A1 | 7/2007 | Satoh et al. |
| 2007/0269297 A1 | 11/2007 | Meulen et al. |
| 2008/0175694 A1 | 7/2008 | Park et al. |
| 2008/0232947 A1 | 9/2008 | van der Meulen et al. |
| 2008/0266037 A1 | 10/2008 | Williams |
| 2009/0314211 A1 | 12/2009 | Du Bois et al. |
| 2010/0062592 A1 | 3/2010 | Clark |
| 2010/0136773 A1 | 6/2010 | Akae et al. |
| 2010/0226737 A1 | 9/2010 | Sakaue et al. |
| 2011/0312189 A1 | 12/2011 | Kim et al. |
| 2012/0109355 A1 | 5/2012 | Baccini et al. |
| 2012/0213614 A1 | 8/2012 | Bonora et al. |
| 2012/0249291 A1 | 10/2012 | Holcomb et al. |
| 2013/0171757 A1 | 7/2013 | Ponnekanti et al. |
| 2014/0020629 A1 | 1/2014 | Tsai et al. |
| 2016/0240370 A1* | 8/2016 | Yamasaki ......... H01L 21/28562 |
| 2018/0339816 A1 | 11/2018 | Oldendorf et al. |
| 2018/0374732 A1 | 12/2018 | Klein et al. |
| 2019/0348264 A1 | 11/2019 | Tsai et al. |
| 2020/0232088 A1 | 7/2020 | White et al. |
| 2020/0262060 A1 | 8/2020 | Hosek et al. |
| 2020/0262660 A1 | 8/2020 | Hosek et al. |
| 2020/0381276 A1 | 12/2020 | Yedla et al. |
| 2021/0024929 A1 | 1/2021 | Yokota et al. |
| 2021/0249291 A1 | 8/2021 | Raatz et al. |
| 2021/0265188 A1 | 8/2021 | Moura et al. |
| 2021/0296150 A1 | 9/2021 | Berger et al. |
| 2021/0328146 A1 | 10/2021 | Heymanns et al. |
| 2021/0354934 A1 | 11/2021 | Aust et al. |
| 2022/0003718 A1 | 1/2022 | Watanabe |
| 2022/0013383 A1 | 1/2022 | Savandaiah et al. |
| 2022/0037181 A1 | 2/2022 | Hatano et al. |
| 2022/0130700 A1 | 4/2022 | Newman et al. |
| 2022/0208426 A1 | 6/2022 | Aust et al. |
| 2022/0293451 A1 | 9/2022 | Sulyman et al. |
| 2022/0293452 A1 | 9/2022 | Sulyman et al. |
| 2022/0336258 A1 | 10/2022 | Srivastava et al. |
| 2022/0393618 A1 | 12/2022 | Aust et al. |
| 2022/0415635 A1 | 12/2022 | Yedla et al. |
| 2022/0415687 A1 | 12/2022 | Hatano et al. |
| 2022/0415688 A1 | 12/2022 | Hatano et al. |
| 2023/0132174 A1 | 4/2023 | Thanu et al. |

FOREIGN PATENT DOCUMENTS

| | | |
|---|---|---|
| DE | 102018006259 A1 | 12/2019 |
| EP | 1681261 A1 | 7/2006 |
| EP | 4222779 A1 | 8/2023 |
| JP | 62121134 A | 6/1987 |
| JP | H06324297 A | 11/1994 |
| JP | 2004214312 A | 7/2004 |
| JP | 2008177507 A | 7/2008 |
| KR | 10-2007-0080768 A | 8/2007 |
| KR | 10-20210081597 A | 7/2021 |
| KR | 20220099611 A | 7/2022 |
| KR | 1020220099611 A | 7/2022 |
| TW | 202141675 A | 11/2021 |
| WO | 2008077048 A2 | 6/2008 |
| WO | 2011102410 A1 | 8/2011 |
| WO | 2015007385 A1 | 1/2015 |
| WO | 2015043712 A1 | 4/2015 |
| WO | 2015140155 A1 | 9/2015 |
| WO | 2015158725 A1 | 10/2015 |
| WO | 2015162177 A1 | 10/2015 |
| WO | 2015189263 A1 | 12/2015 |
| WO | 2016162288 A1 | 10/2016 |
| WO | 2019037858 A1 | 2/2019 |
| WO | 2019052657 A1 | 3/2019 |
| WO | 2019145035 A1 | 8/2019 |
| WO | 2019238416 A1 | 12/2019 |
| WO | 2020126040 A1 | 6/2020 |
| WO | 2020192911 A1 | 10/2020 |
| WO | 2021106796 A1 | 6/2021 |
| WO | 2021106799 A1 | 6/2021 |
| WO | 2021223843 A1 | 11/2021 |
| WO | 2022044834 A1 | 3/2022 |

OTHER PUBLICATIONS

U.S. Appl. No. 18/141,909, filed May 1, 2023.
U.S. Appl. No. 18/141,914, filed May 1, 2023.
U.S. Appl. No. 18/141,920, filed May 1, 2023.
U.S. Appl. No. 18/141,923, filed May 1, 2023.
U.S. Appl. No. 18/141,926, filed May 1, 2023.
U.S. Appl. No. 18/141,931, filed May 1, 2023.
International Search Report and Written Opinion in related application PCT/US2023/035709 dated Feb. 5, 2024.
International Search Report/ Written Opinion issued to PCT/US2023/079455 on Mar. 6, 2024.
Yu et al.; Controller design and implementation of six-degree-of-freedom magnetically levitated positioning system with high precision; Proc. IMechE vol. 222 Part I: J. Systems and Control Engineering; 12 pages.
Zhu et al; Design and Control of a Six Degrees-of-Freedom Magnetically Levitated Positioning System; IFAC PapersOnLine 49-21 (2016) pp. 127-132.
Temposonics; Sensor Selector Guide; Retrieved from the Internet at: <https://www.temposonics.com/docs/temposonicslibraries/literature/sensor_selector_guide_industrial_551814_en.pdf?sfvrsn=5fde8874_12>; 21 pages.
Linear Motion Tips; How do Magnettostrictive sensors work ?; Retrieved from the Internet at: <https://www.linearmotiontips.com/how-do-magnetostrictive-sensors-work/> 9 Pages.
International Search Report and Written Opinion issued to Application No. PCT/US2024/039230 on Nov. 5, 2024 in 8 pages.

* cited by examiner

PASSIVE LIFT PIN ASSEMBLY

BACKGROUND

Field

Embodiments of the present disclosure generally relate to lift pins for positioning a substrate relative to a substrate support in a substrate processing chamber.

Description of the Related Art

Lift pins are typically used in the semiconductor process tooling, such as a processing chamber, to support and position a substrate during substrate transfer operations. In conventional designs, the lift pins generally reside in guide holes disposed through the substrate support disposed within the processing chamber. In these conventional designs, the upper ends of the lift pins are typically flared to allow the lift pins, when positioned in a lowered position, to be positioned against a mating portion of a substrate support and prevent the pins from passing through the guide holes formed in the substrate support. The lower ends of the lift pins extend below the substrate support and are actuated by a lift plate that contacts the pins at the lower ends of the lift pins. The lift plate is movable in a vertical direction between upper and lower positions. In transitioning from the upper position to the lower position, the lift plate moves the lift pins downwards to lower a substrate onto the substrate support. In transitioning from the lower position to the upper position, the lift plate moves the lift pins upwards to extend the upper ends of the lift pins above the substrate support to contact the substrate, and raise the substrate above the substrate support to facilitate substrate transfer. Guided lift pins designs will generate particles and commonly lead to eventual failure (e.g., jamming) due to the repeated interaction between surfaces of the lift pin and surfaces of the substrate support guide hole.

The lift plate is typically powered by one or more electrical or pneumatic actuators and a control system, which add complexity and cost to a processing chamber. In some instances, the lift pins do not contact the substrate simultaneously, or do not raise or lower the substrate evenly. The substrate can slip, and can be incorrectly positioned on the substrate support, which will generate particles on the substrate and adversely affects the processing of the substrate. There is a need for improved systems that address such problems.

SUMMARY

The present disclosure generally relates to lift pins for positioning a substrate relative to a substrate support in a substrate processing chamber.

In one implementation, a substrate support assembly includes a substrate support moveable between a raised position, a lowered position below the raised position, and an intermediate position between the raised and lowered positions, the substrate support including a support surface configured to receive a substrate, and a reference surface. The substrate support assembly also includes a lift pin assembly including a lift plate and a plurality of lift pins. Each lift pin is disposed in a corresponding hole through the substrate support, and includes a first end coupled to a first surface of the lift plate, and a second end on an opposite end of the lift pin from the first end. The substrate support assembly also includes a stop plate positioned below the support surface of the substrate support, and configured to limit an upward movement of the lift plate. The substrate support assembly also includes a plurality of biasing members coupled to a second surface of the lift plate opposite the first surface of the lift plate. The lift plate is disposed between the plurality of biasing members and the reference surface of the substrate support. In use, the substrate support assembly transitions between first and second configurations. In the first configuration, the plurality of biasing members biases the lift plate against the reference surface of the substrate support while the substrate support moves between the lowered position and the intermediate position. In the second configuration, the stop plate prevents upward movement of the lift plate while the substrate support moves between the intermediate position and the raised position.

In another implementation, a substrate support assembly includes a substrate support moveable between a raised position and a lowered position. The substrate support includes a support surface configured to receive a substrate, and a reference surface. The substrate support assembly also includes a lift pin assembly including a lift plate and a plurality of lift pins. Each lift pin of the plurality of lift pins has a first end that is coupled to a first surface of the lift plate and a second end that is on an opposite end of the lift pin from the first end. A hole formed through the substrate support is configured to receive a lift pin of the plurality of lift pins. The substrate support assembly also includes a plurality of biasing members and a stop plate positioned below the support surface of the substrate support. The stop plate is configured to limit an upward movement of the lift plate. The lift plate is disposed between the plurality of biasing members and the stop plate. The plurality of biasing members comprises three or more biasing members. The plurality of biasing members is configured to bias the lift plate against the reference surface of the substrate support when the reference surface is positioned below a contact surface of the stop plate. The plurality of biasing members is configured to bias the lift plate against the contact surface of the stop plate when the reference surface is positioned above the contact surface of the stop plate.

In another implementation, a method of manipulating a substrate, includes moving a substrate support upwards from a lowered position to an intermediate position. A plurality of lift pins protrudes from a support surface of the substrate support, and is positioned on an upper surface of a lift plate. The lift plate and the plurality of lift pins move simultaneously with the substrate support. The method further includes contacting the substrate with the plurality of lift pins while the substrate support and the plurality of lift pins move simultaneously. The method further includes moving the substrate support upwards from the intermediate position towards a raised position while the plurality of lift pins remains stationary. The method further includes lifting the substrate by the substrate support off the plurality of lift pins while the substrate support moves towards the raised position.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure concerns lift pins for positioning a substrate relative to a substrate support in a substrate processing chamber, such as during transferring operations.

Figure 1:
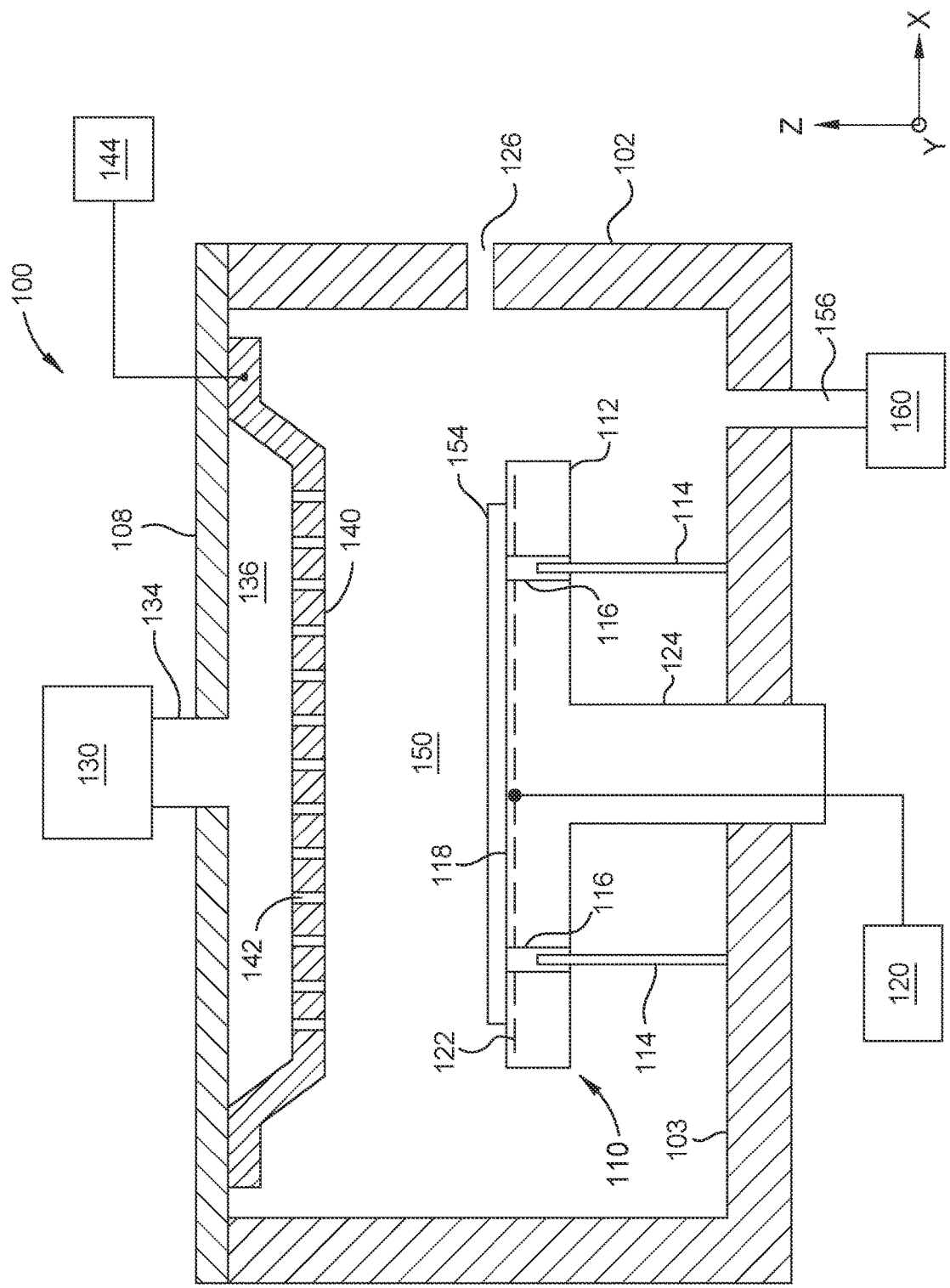
FIG. 1 is a schematic view of a processing chamber.

FIG. 1 illustrates a schematic cross-sectional view of a processing chamber 100. In general, the processing chamber 100 can include an atomic layer deposition (ALD) chamber, chemical vapor deposition (CVD) chamber, physical vapor deposition (PVD) chamber, etch chamber, degas chamber, an ion implantation chamber, ashing chamber, cleaning chamber, a thermal processing chamber (e.g., rapid thermal processing, anneal, cool down, thermal management control), or other type of substrate processing chamber.

However, as illustrated in FIG. 1, the processing chamber 100 is configured as a Plasma Enhanced Chemical Vapor Deposition ("PECVD") chamber. Nevertheless, the processing chamber 100 may be configured to perform one or more other processing operations that may or may not involve a plasma. The processing chamber 100 may include relevant hardware associated with any of the above processes.

The processing chamber 100 includes a chamber body 102 with a floor 103, a substrate support assembly 110 disposed inside the chamber body 102, and a lid 108 coupled to the chamber body 102. In some embodiments, as illustrated in FIG. 1, the processing chamber 100 includes a showerhead 140 that can serve as an electrode, and is coupled to a power source 144 through a match circuit (not shown). The power source 144 is a radio frequency (RF) power source that is electrically coupled to the electrode. Further, the power source 144 provides between about 100 Watts and about 3,000 Watts at a frequency of about 50 kHz to about 15 MHz. In some embodiments, the power source 144 can be pulsed during various operations. The electrode and power source 144 facilitate control of a plasma formed within the processing volume 150.

The showerhead 140 features openings 142 for admitting a process gas or gases into a processing volume 150 from a gas supply source 130. The process gases are supplied to the processing chamber 100 via the gas feed 134, and the process gases enter a plenum 136 prior to flowing through the openings 142. In some embodiments, different process gases that are flowed simultaneously during a processing operation enter the processing chamber 100 via separate gas feeds and separate plenums prior to entering the processing volume 150 through the showerhead 140.

The gas supply source 130 includes one or more gas sources. The gas supply source 130 is configured to deliver the one or more gases from the one or more gas sources through the showerhead 140 and into the processing volume 150. Each of the one or more gas sources provides a process gas such as silane, disilane, tetraethyl orthosilicate (TEOS), germane, a metal halide (such as titanium tetrachloride, tantalum pentachloride, tungsten hexafluoride), an organometallic (such as tetrakis(dimethylamido) titanium, pentakis (dimethylamido) tantalum), ammonia, oxygen ($O_2$), hydrogen peroxide, hydrogen, diborane, chlorine ($Cl_2$), sulfur hexafluoride, a hydrocarbon (generically $C_xH_y$), among others. In some embodiments, the process gas may be ionized to form a plasma within the processing volume 150. In an example, one or more of a carrier gas and an ionizable process gas are provided into the processing volume 150 to process a substrate 154. For instance, when processing a 300 mm substrate, the process gases are introduced to the processing chamber 100 at a flow rate from about 6500 sccm to about 8000 sccm, from about 100 sccm to about 10,000 sccm, or from about 100 sccm to about 1000 sccm. Alternatively, other flow rates may be utilized. In some examples, a remote plasma source can be used to deliver plasma to the processing chamber 100 and can be coupled to the gas supply source 130.

In some embodiments, the processing chamber 100 includes a physical vapor deposition (PVD) target, which is similarly positioned as the showerhead 140 illustrated in FIG. 1, and thus takes the place of the showerhead 140. In this configuration, the PVD target serves as a sputtering material source, and is coupled to the power source 144, which is typically a DC power source. The DC power source is adapted to provide a DC voltage at a power level that is typically greater than 1 kW. A magnetron (e.g., magnet assembly not shown) is positioned behind the PVD target and is used to help control the gas ion bombardment of the lower surface of the target during processing to allow for the uniform erosion (e.g., sputtering) of the target surface during processing.

In either or any of the various possible processing chamber configurations, the substrate support assembly 110 includes a substrate support 112 that is configured to support the substrate 154 on a support surface 118 in the processing volume 150 of the processing chamber 100 during processing. The substrate support 112 is disposed on a shaft 124 that is configured to raise and lower the substrate support 112 by use of an actuator assembly (not shown) that is coupled to the shaft 124. In some embodiments, the actuator assembly includes a guide rail (not shown) and electrical motor (not shown) or pneumatic actuator (not shown) that is configured to guide and drive the substrate support 112 in a first direction (i.e., vertical direction). When driven in the first direction, the support surface 118 is a closer distance to (or a further distance from) the floor 103, or in an alternate view, is a further distance from (or a closer distance to) the showerhead or the PVD target. In some embodiments that may be combined with other embodiments, the substrate support 112 is rotated by the shaft 124 while the substrate 154 is undergoing processing in the processing chamber 100.

The substrate support assembly 110 includes one or more lift pins 114, each of which is disposed through a corresponding hole 116 in the substrate support 112. It is contemplated that the substrate support assembly will typically include three or more lift pins 114, but may include more lift pins 114. The lift pins 114 are moveable to lift the substrate 154 off the support surface 118 to facilitate transfer of the substrate 154 into and out of the processing chamber 100. The substrate 154 is provided to the processing volume 150 through an opening 126. In an example, the substrate 154 is transported into or out of the processing volume 120 using a carrier that is conveyed by a robotic arm. In another example, the substrate 154 is transported into or out of the processing volume 120 using a carrier that is conveyed by magnetic levitation.

The substrate support 112 contains, or is formed from, one or more metallic or ceramic materials. Exemplary metallic or ceramic materials include one or more metals, metal oxides, metal nitrides, metal oxynitrides, or any combination thereof. For example, the substrate support 112 may contain or be formed from aluminum, aluminum oxide, aluminum nitride, aluminum oxynitride, or any combination thereof.

As illustrated, an electrode 122 is embedded within the substrate support 112, but alternatively may be coupled to a surface (such as support surface 118) of the substrate support 112. The electrode 122 is coupled to a power source 120. It is contemplated that the power source 120 may supply DC power, pulsed DC power, radio frequency (RF) power, pulsed RF power, or any combination thereof. The power source 120 is configured to drive the electrode 122 with a drive signal to generate a plasma within the processing volume 150. It is contemplated that the drive signal may be one of a DC signal and a varying voltage signal (e.g., RF signal). Further, the electrode 122 may alternatively be coupled to the power source 144 instead of the power source 120, and the power source 120 may be omitted.

In some embodiments that may be combined with other embodiments, the electrode 122 may be omitted. In some embodiments that may be combined with other embodiments, the electrode 122 (or another electrode in the substrate support 112) is configured as a chucking electrode. In some embodiments that may be combined with other embodiments, the substrate support 112 includes a heater, such as a resistive heating element. In some embodiments that may be combined with other embodiments, the substrate support 112 includes one or more coolant channels.

An exhaust port 156 is coupled to a vacuum pump 160. The vacuum pump 160 removes excess process gases or by-products from the processing volume 150 via the exhaust port 156 during and/or after processing.

The substrate support assembly 110 of FIG. 1 may be configured according to any of the substrate support assemblies 200, 300, 400, 500, or 600, described below.

Figure 2A:
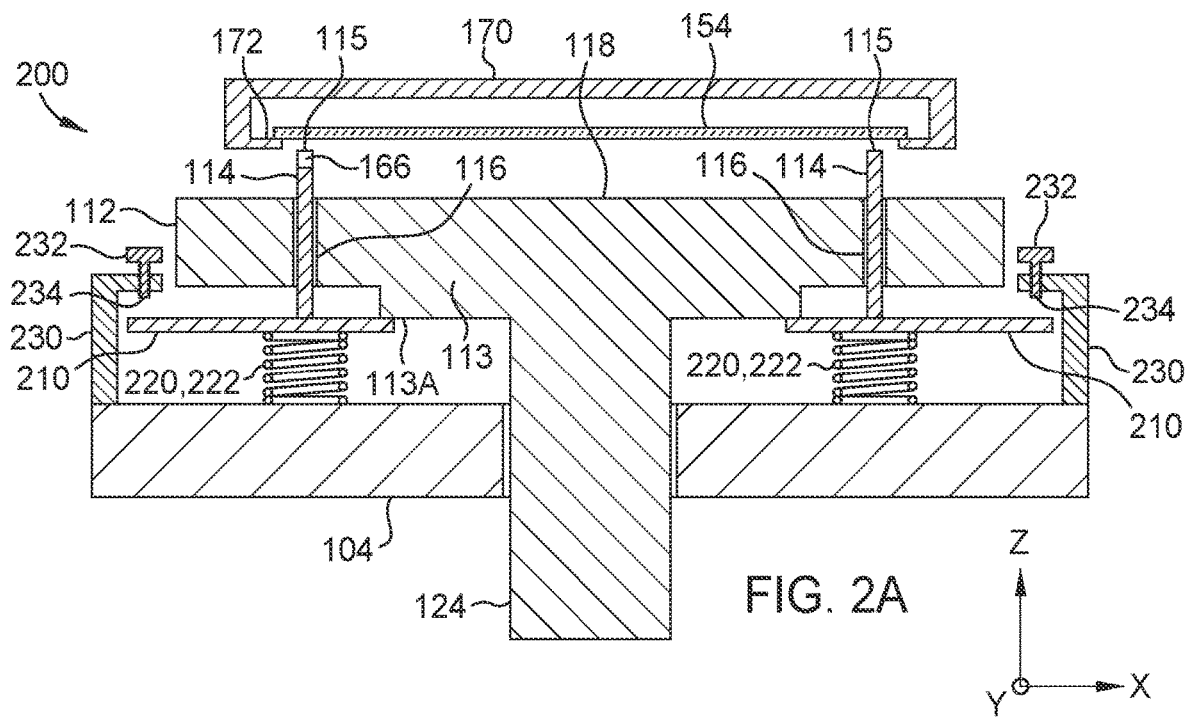
FIGS. 2A to 2D schematically illustrate a substrate support assembly that may be used in the processing chamber of FIG. 1.
Figure 2B:
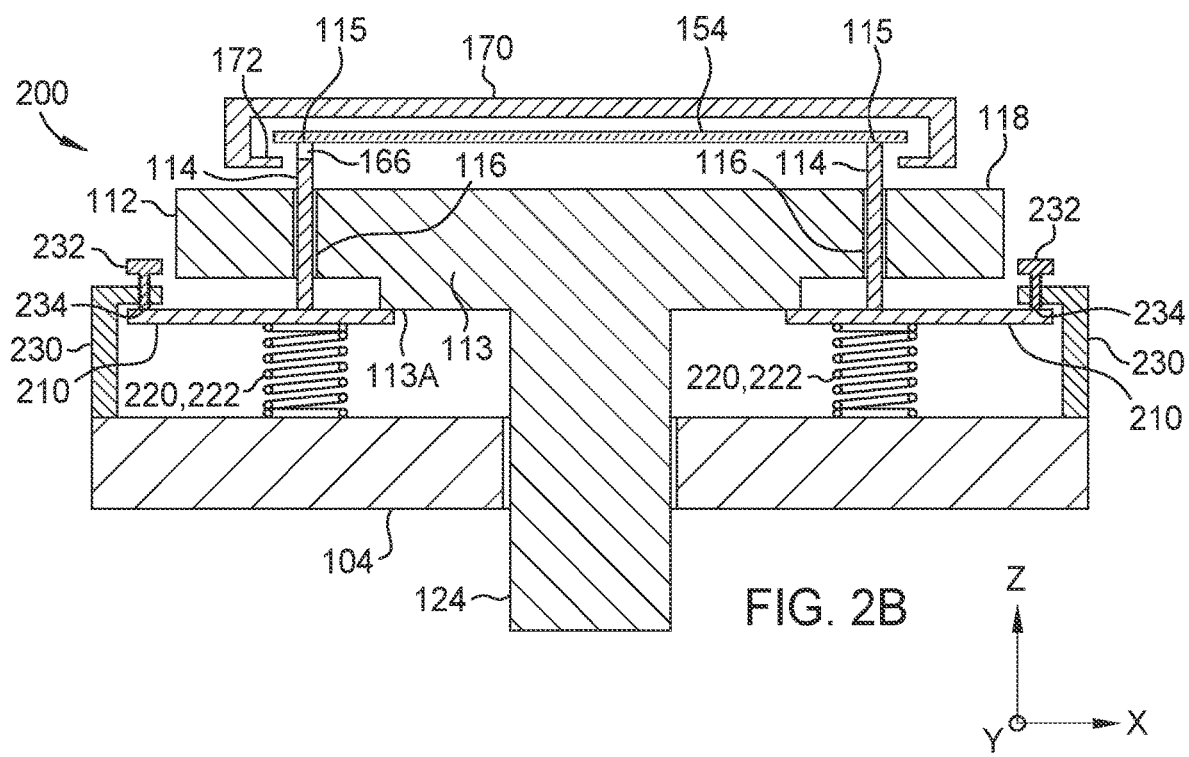
Figure 2C:
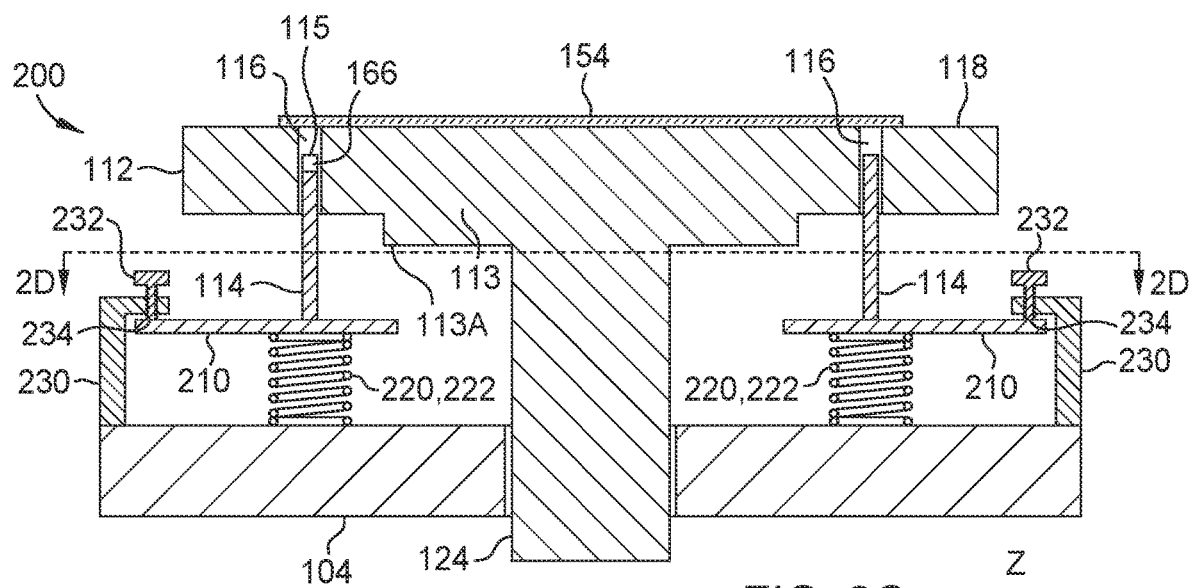
Figure 2D:
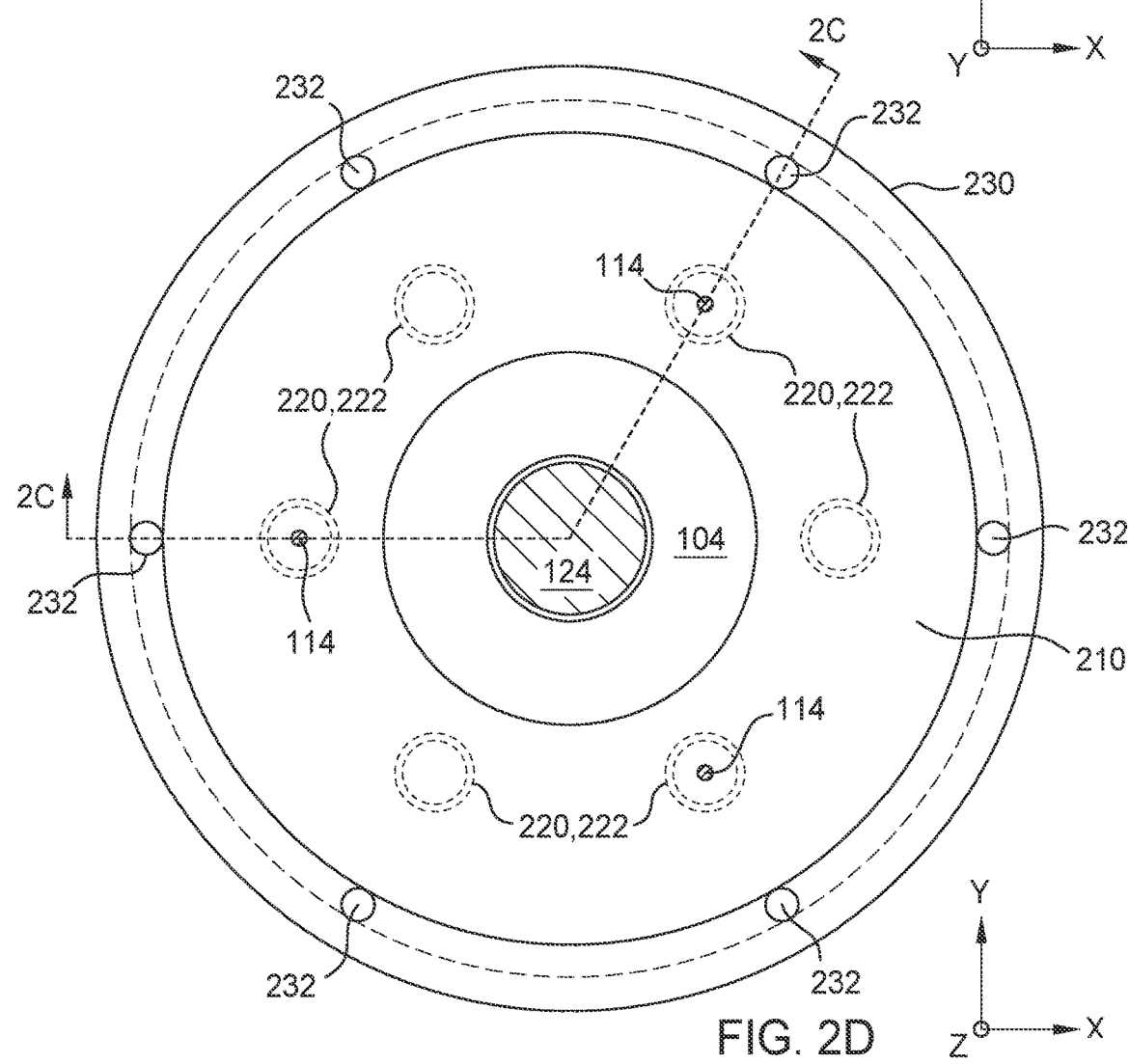

FIGS. 2A to 2C schematically illustrate a substrate support assembly 200. The substrate support assembly 200 includes the substrate support 112 disposed on the shaft 124. The substrate support 112 is moveable between a raised position, a lowered position below the raised position, and an intermediate position between the raised and lowered positions by use of the actuator assembly described above. FIG. 2A shows the substrate support 112 in the lowered position; FIG. 2B shows the substrate support 112 in the intermediate position; and FIG. 2C shows the substrate support 112 in the raised position. FIG. 2D is a top cross-sectional view showing aspects of an exemplary configuration of the substrate support assembly 200.

The substrate support assembly 200 includes lift pins 114, each of which is disposed through a corresponding hole 116 in the substrate support 112. In some embodiments that may be combined with other embodiments, the substrate support assembly 200 includes three lift pins 114. In some embodiments that may be combined with other embodiments, the substrate support assembly 200 includes more than three lift pins 114, such as four or more, five or more, or six or more lift pins 114.

In some embodiments that may be combined with other embodiments, a sensor 166 is disposed at an upper end 115 of one or more of the lift pins 114. In some embodiments that may be combined with other embodiments, the sensor 166 detects a temperature of a substrate (such as substrate 154) or a substrate carrier 170 (i.e., hereafter carrier 170) that is proximal to the sensor 166. In an example, the sensor 166 is a thermocouple, RTD, or a thermopile. In another example, the sensor 166 includes an optical temperature measurement device that utilizes an optical fiber that has an end disposed at the tip of the lift pin 114 (at the upper end 115) and an opposing end that transmits the electromagnetic radiation to a radiation detection sensor that is disposed outside of the processing chamber 100. In some embodiments that may be combined with other embodiments, the sensor 166 is configured to detect a presence of a substrate (such as substrate 154) or the carrier 170 by use of an optical or electrical detection technique. In an example, the sensor 166 is a proximity sensor or a strain gauge.

In some embodiments that may be combined with other embodiments, each of two or more lift pins 114 has a sensor 166 of a common type (such as temperature sensor, proximity sensor, or strain gauge) disposed thereon. In some embodiments that may be combined with other embodiments, a first sensor 166 of a first type (such as one of a temperature sensor, proximity sensor, or strain gauge) is disposed on a first lift pin 114, and a second sensor 166 of a second type (such as another of a temperature sensor, proximity sensor, or strain gauge) is disposed on a second lift pin 114.

In some embodiments that may be combined with other embodiments, the sensor 166 communicates with a controller wirelessly, such as by RF, Bluetooth, or the like. In some embodiments that may be combined with other embodiments, the sensor(s) 166 may be omitted.

As illustrated in FIGS. 2A-2C, each lift pin 114 is disposed on a lift plate 210. In some embodiments that may be combined with other embodiments, each lift pin 114 is disposed on a separate lift plate 210. In some embodiments that may be combined with other embodiments, two or more lift pins 114 are disposed on the same lift plate 210. In some embodiments that may be combined with other embodiments, every lift pin 114 is disposed on the same lift plate 210. In some embodiments that may be combined with other embodiments, the lift plate 210 is in the form of a ring or a partial ring around the shaft 124.

One or more biasing members 220, such as spring 222, are disposed between the (or each) lift plate 210 and a base 104. In some embodiments that may be combined with other embodiments, the base 104 is a fixed structure, such as a plinth, a beam, or a wall within the processing chamber 100. In some embodiments that may be combined with other embodiments, the base 104 is part of, or disposed on, the floor 103 of the processing chamber 100. The substrate support 112 moves vertically with respect to the base 104.

The spring 222 is a compression spring, such as a coil spring, a Belleville spring, or the like. In some embodiments that may be combined with other embodiments, each biasing member 220 is a bellows, such as bellows 322, described below with respect to FIGS. 3A to 3C. In some embodiments that may be combined with other embodiments, each biasing member 220 is a flexure, such as flexure 422, described below with respect to FIGS. 4A to 4C.

In some embodiments that may be combined with other embodiments, the substrate support assembly 200 includes a single biasing member 220 that encircles the shaft 124. In some embodiments that may be combined with other embodiments, the substrate support assembly 200 includes a plurality of biasing members 220, such as two or more, three or more, four or more, five or more, or six or more biasing members 220. It is contemplated that each biasing member 220 may be disposed at a discrete location on the base 104 around the shaft 124.

In some embodiments that may be combined with other embodiments, the number of biasing members 220 is less than the number of lift pins 114. In some embodiments that may be combined with other embodiments, the number of biasing members 220 equals the number of lift pins 114. In some embodiments that may be combined with other embodiments, the number of biasing members 220 is greater than the number of lift pins 114. It has been found that utilizing a plurality of biasing members 220 in an array type pattern in the horizontal plane (X-Y plane) is able to provide improved lateral stability (i.e., X and Y directions) and torsional stability (e.g., yaw stability), and control of the vertical motion of the lift pins (e.g., pitch and roll stability). It has been found that arrays of at least three or more biasing members 220, such as four or more biasing members 220, or five or more biasing members 220, or six or more biasing members 220 provide improved results. In one example, the support assembly 200 includes at least six biasing members 220.

FIG. 2D is a top cross-sectional view showing aspects of an exemplary configuration of the substrate support assembly 200. In the illustrated example, there are three lift pins 114 and six biasing members 220 that are aligned in a circular array about a central axis that is coincident with the central axis of the shaft 124. The lift pins 114 rest on a common lift plate 210 that is disposed around the shaft 124. The biasing members are disposed below the lift plate 210. As illustrated, in some embodiments that may be combined with other embodiments, at least one biasing member 220 is aligned vertically with a corresponding lift pin 114, and aligned parallel to the central axis of the shaft 124. In some embodiments that may be combined with other embodiments, every biasing member 220 is aligned vertically with a corresponding lift pin 114. In some embodiments that may be combined with other embodiments, at least one biasing member 220 is not aligned vertically with a lift pin 114. In some embodiments that may be combined with other embodiments, at least one biasing member 220 is aligned vertically with a corresponding lift pin 114, and at least one other biasing member 220 is not aligned vertically with a lift pin 114. In some embodiments that may be combined with other embodiments, every biasing member 220 is not aligned vertically with a lift pin 114.

In some embodiments that may be combined with other embodiments, each biasing member 220 is disposed below a separate lift plate 210. In some embodiments that may be combined with other embodiments, a plurality biasing members 220 are disposed below the same lift plate 210. In some embodiments that may be combined with other embodiments, every biasing member 220 is disposed below the same lift plate 210, such as illustrated in FIG. 2D. In some embodiments that may be combined with other embodiments, the (or each) lift plate 210 is integral with one or more of the biasing members 220.

In some embodiments, a plurality of biasing members 220 bias each lift pin 114 upwards. The plurality of biasing members 220 bias the (or each) lift plate 210 upwards. The plurality of biasing members 220 bias the (or each) lift plate 210 towards the substrate support 112. Returning to FIGS. 2A to 2C, the plurality of biasing members 220 bias the (or each) lift plate 210 towards a corresponding stop plate 230. The stop plate 230 is coupled to the base 104. The stop plate 230 includes a contact surface that can include a lip, ledge, shoulder, or the like that provides a maximum extent of vertical travel of the (or each) lift plate 210 above the base 104. In one example the contact surface is a planar surface that is positioned over, and configured to contact, a surface of the lift plate 210 when the lift plate 210 is in its top most position. The stop plate 230 is generally configured to control the upper most position of the lift pins 114 and lift plate 210, and also control how level the lift pins 114 and lift plate 210 are relative to a horizontal plane (X-Y plane) and/or substrate supporting surface 118. The ability to control how level the tips of the lift pins 114 (e.g., substrate supporting portions of the lift pins 114) are relative to the support surface 118 has been found to be useful to avoid the sliding of the substrate relative to the support surface 118 due to a misalignment of the lower surface of the substrate to the support surface 118 as the two surfaces are brought into engagement and disengagement during a substrate transferring process. The sliding motion generates scratches and particles on the lower surface of the substrate, which will affect downstream substrate processing processes, such a lithography processes. The avoidance of such a sliding motion is a beneficial feature of the substrate support assembly 200.

In some embodiments that may be combined with other embodiments, the substrate support assembly 200 includes a single stop plate 230, such as in the form of a ring or a partial ring around the shaft 124. In some embodiments that may be combined with other embodiments, the substrate support assembly 200 includes two or more stop plates 230, such as three or more, four or more, or five or more stop plates 230. In one example, the substrate support assembly 200 includes three or more stop plates 230.

In some embodiments that may be combined with other embodiments, the number of biasing members 220 is less than the number of stop plates 230. In some embodiments that may be combined with other embodiments, the number of biasing members 220 equals the number of stop plates 230. In some embodiments that may be combined with other embodiments, the number of biasing members 220 is greater than the number of stop plates 230.

In some embodiments that may be combined with other embodiments, the number of lift pins 114 is less than the number of stop plates 230. In some embodiments that may be combined with other embodiments, the number of lift pins 114 equals the number of stop plates 230. In some embodiments that may be combined with other embodiments, the number of lift pins 114 is greater than the number of stop plates 230.

The stop plate 230 includes one or more adjustment mechanisms 232 that are configured to alter a distance between the base 104 and the contact surface of the stop plate 230 and a corresponding lift plate 210. In some embodiments, the contact surface of the stop plate 230 is defined by one or more of the contact points 234 of the stop plate 230. In an example, each adjustment mechanism 232 includes a screw that includes a tip that is used to define the contact surface. In another example, each adjustment mechanism 232 includes a solenoid that has a solenoid shaft that has a tip that is used to define the contact surface. In another example, each adjustment mechanism 232 includes a locking bolt that includes a tip that is used to define the contact surface. In some embodiments that may be combined with other embodiments, each adjustment mechanism 232 is operated manually in-situ. In some embodiments that may be combined with other embodiments, each adjustment mechanism 232 is operated remotely, such as by a controller located outside the processing chamber 100.

In some embodiments that may be combined with other embodiments, the number of biasing members 220 is less than the number of adjustment mechanisms 232. In some embodiments that may be combined with other embodiments, the number of biasing members 220 equals the number of adjustment mechanisms 232. In some embodiments that may be combined with other embodiments, the number of biasing members 220 is greater than the number of adjustment mechanisms 232.

In some embodiments that may be combined with other embodiments, the number of lift pins 114 is less than the number of adjustment mechanisms 232. In some embodiments that may be combined with other embodiments, the number of lift pins 114 equals the number of adjustment mechanisms 232. In some embodiments that may be combined with other embodiments, the number of lift pins 114 is greater than the number of adjustment mechanisms 232.

The alteration of the (or each) adjustment mechanism 232 provides for changing a maximum extent of vertical travel of the (or each) lift plate 210 above the base 104. The alteration of the (or each) adjustment mechanism 232 provides for changing a maximum height of the upper end 115 of each lift pin 114 above the base 104. In an example, the (or each) adjustment mechanism 232 is altered such that when each lift pin 114 of a plurality of lift pins 114 is positioned at the maximum height above the base 104, the upper ends 115 of the lift pins 114 are in a common horizontal plane.

FIG. 2A shows the substrate support 112 in the lowered position. The plurality of biasing members 220 bias the (or each) lift plate 210 upwards and against a shoulder 113 of the substrate support 112. The one or more biasing members 220 bias the lift pins 114 towards an "up" position in which the upper ends 115 of the lift pins 114 protrude from the support surface 118 of the substrate support 112. The vertical distance between the tips of the lift pins 114 and the support surface 118 is well controlled and maintained due to the contact created by the biasing members 220 urging the lift plate 210 against a surface (i.e., reference surface 113A) of the shoulder 113. As shown in FIG. 2A, the (or each) lift plate 210 is not in contact with the stop plate 230. The carrier 170 with a substrate 154 resting on a lip 172 thereof is positioned above the substrate support 112, and out of contact with the substrate support assembly 200.

FIG. 2B shows the substrate support 112 in the intermediate position. The substrate support 112 has moved upwards from the lowered position. During movement of the substrate support 112 upwards from the lowered position to the intermediate position, the one or more biasing members 220 continue to bias the (or each) lift plate 210 upwards and against the reference surface 113A of the shoulder 113 of the substrate support 112. Additionally, the one or more biasing members 220 continue to bias the lift pins 114 towards the "up" position. In such a manner, the substrate support 112 and the lift pins 114 are coupled such that the lift pins 114 move upwards simultaneously with the substrate support 112, and remain protruding from the support surface 118. When the substrate support 112 is in the intermediate position, the (or each) lift plate 210 contacts the (or each) stop plate 230, such as at the corresponding adjustment mechanism 232.

As illustrated in FIG. 2B, the lift pins 114 have lifted the substrate 154 off the lip 172 of the carrier 170. In some embodiments that may be combined with other embodiments, an elevation of the carrier 170 within the processing chamber 100 is not changed while the substrate support 112 moves from the lowered position to the intermediate position. In some embodiments that may be combined with other embodiments, the lift pins 114 lift the substrate 154 off the carrier 170, and then the carrier 170 is removed from the processing chamber 100 before the substrate support 112 reaches the intermediate position. In some embodiments that may be combined with other embodiments, the carrier 170 is removed from the processing chamber 100 after confirming (such as by using the one or more sensors 166) that the lift pins 114 have lifted the substrate 154 off the carrier 170.

FIG. 2C shows the substrate support 112 in the raised position. The one or more biasing members 220 continue to bias the (or each) lift plate 210 upwards and against the (or each) stop plate 230. The lift pins 114 remain disposed on the (or each) lift plate 210. The substrate support 112 has moved upwards from the intermediate position. During movement of the substrate support 112 upwards from the intermediate position to the raised position, the shoulder 113 of the substrate support 112 moves away from, and out of contact with, the (or each) lift plate 210. In such a manner, the substrate support 112 and the lift pins 114 are decoupled such that the lift pins 114 remain stationary while the substrate support 112 moves upwards from the intermediate position to the raised position. For example, the substrate support 112 moves upwards with respect to the floor 103 of the processing chamber 100, whereas the lift pins 114 do not move upwards or downwards with respect to the floor 103 of the processing chamber 100.

As illustrated, the lift pins 114 are in a "down" position with respect to the substrate support 112 such that the upper ends 115 of the lift pins 114 do not protrude from the support surface 118 of the substrate support 112. The substrate support 112 has lifted the substrate 154 off the lift pins 114. The substrate 154 is supported by the support surface 118 of the substrate support 112. The raised position of the substrate support 112 corresponds to a position of the substrate 154 when undergoing a processing operation in the processing chamber 100.

When the substrate support 112 is moved down from the raised position to the intermediate position, the lift pins 114 remain stationary. For example, the substrate support 112 moves downwards with respect to the floor 103 of the processing chamber 100, whereas the lift pins 114 do not move upwards or downwards with respect to the floor 103 of the processing chamber 100. As the substrate support 112 moves down near to the intermediate position, the lift pins 114 (while remaining stationary) protrude from the support surface 118, and lift the substrate 154 off the support surface 118. Then, the carrier 170 is positioned for receipt of the substrate 154, such as shown in FIG. 2B.

When the substrate support 112 arrives at the intermediate position from the raised position, the shoulder 113 of the substrate support 112 engages the (or each) lift plate 210. When the substrate support 112 is moved down from the intermediate position to the lowered position, the (or each)

lift plate 210 and the lift pins 114 move downward simultaneously and are guided by the substrate support 112, due to the contact between the reference surface 113A of the shoulder 113 and the lift plate 210. As the substrate support 112 moves down from the intermediate position to the lowered position, the lift pins 114 remain protruding from the support surface 118. The substrate 154 moves downwards on the lift pins 114 until the substrate 154 engages the lip 172 of the carrier 170. Further downward movement of the substrate support 112 and the lift pins 114 separates the substrate 154 from the tips of the lift pins 114, and the substrate 154 rests on the lip 172 of the carrier 170.

In some embodiments that may be combined with other embodiments, an elevation of the carrier 170 within the processing chamber 100 is not changed while the substrate support 112 moves from the intermediate position to the lowered position. In some embodiments that may be combined with other embodiments, the substrate 154 engages the lip 172 of the carrier 170, and then the carrier 170 and the substrate 154 are removed from the processing chamber 100 before the substrate support 112 reaches the lowered position. In some embodiments that may be combined with other embodiments, the carrier 170 and the substrate 154 are removed from the processing chamber 100 after confirming (such as by using the one or more sensors 166) that the lift pins 114 no longer support the substrate 154.

Figure 3A:
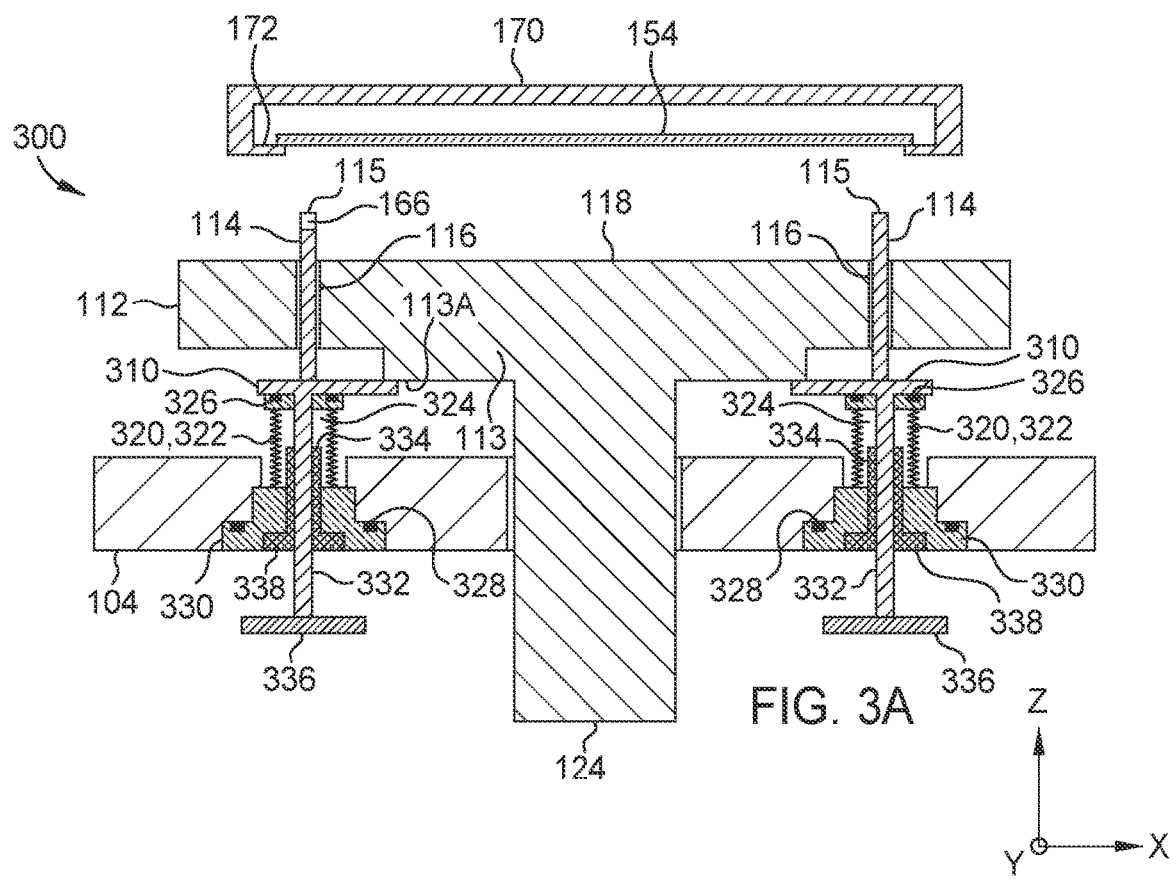
FIGS. 3A to 3C schematically illustrate another substrate support assembly that may be used in the processing chamber of FIG. 1.
Figure 3B:
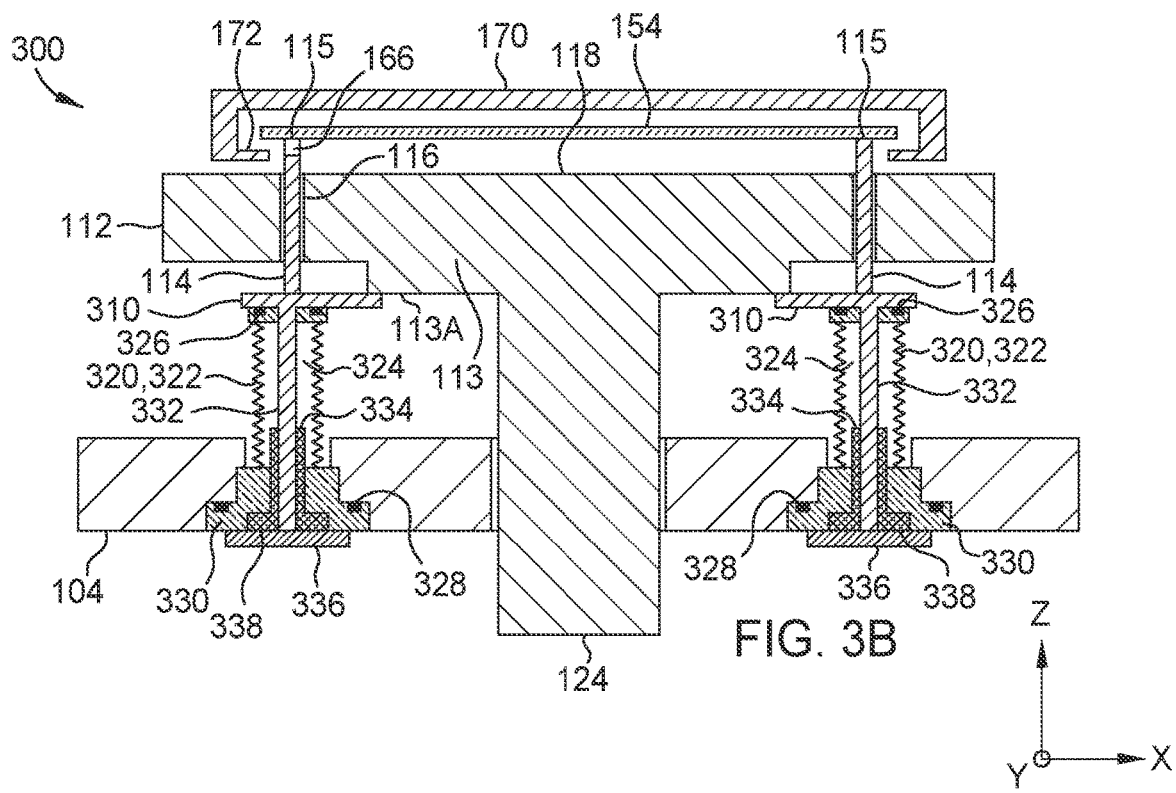
Figure 3C:
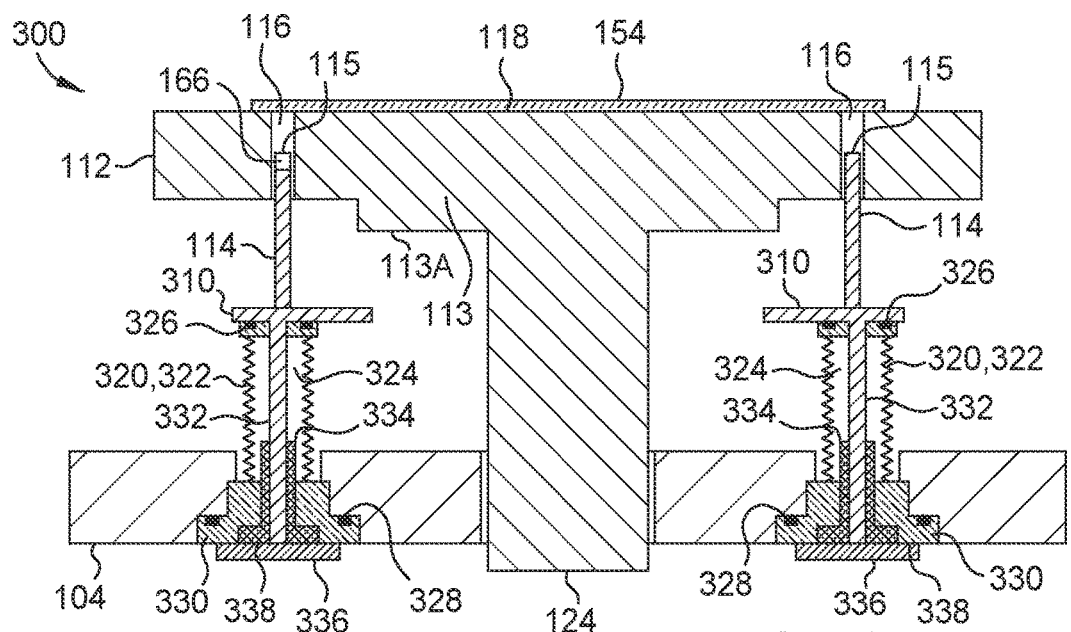

FIGS. 3A to 3C schematically illustrate substrate support assembly 300. The substrate support assembly 300 includes the substrate support 112 disposed on the shaft 124. The substrate support 112 is moveable between a raised position, a lowered position below the raised position, and an intermediate position between the raised and lowered positions. FIG. 3A shows the substrate support 112 in the lowered position; FIG. 3B shows the substrate support 112 in the intermediate position; and FIG. 3C shows the substrate support 112 in the raised position.

It is contemplated that the substrate support assembly 300 may include any one or more of the components, features, or aspects of the substrate support assembly 200, described above. The substrate support assembly 300 includes one or more different or additional components, features, or aspects, such as described below.

The substrate support assembly 300 includes one or more biasing members 320, such as three or more biasing members 320, or even six or more biasing members 320. As illustrated, each biasing member 320 is a bellows 322. In some embodiments that may be combined with other embodiments, each biasing member 320 is a spring, such as spring 222, described above with respect to FIGS. 2A to 2C. In some embodiments that may be combined with other embodiments, each biasing member 320 is a flexure, such as flexure 422, described below with respect to FIGS. 4A to 4C.

In some embodiments that may be combined with other embodiments, the substrate support assembly 300 includes a plurality of bellows 322, such as two or more, three or more, four or more, five or more, or six or more bellows 322. It is contemplated that each bellows 322 may be disposed at a discrete location on the base 104 around the shaft 124.

In some embodiments that may be combined with other embodiments, the number of bellows 322 is less than the number of lift pins 114. In some embodiments that may be combined with other embodiments, the number of bellows 322 equals the number of lift pins 114. In some embodiments that may be combined with other embodiments, the number of bellows 322 is greater than the number of lift pins 114.

In some embodiments that may be combined with other embodiments, each bellows 322 is disposed below a separate lift plate 310. In some embodiments that may be combined with other embodiments, three or more bellows 322 are disposed below the same lift plate 310. In some embodiments that may be combined with other embodiments, every bellows 322 is disposed below the same lift plate 310. A seal 326 between each lift plate 310 and each corresponding bellows 322 facilitates the pressurization of each bellows 322. In some embodiments that may be combined with other embodiments, the (or each) lift plate 310 is integral with one or more of the bellows 322.

Each bellows 322 is mounted to the base 104 via an adapter 330. A seal 328 between the base 104 and each adapter 330 facilitates pressure below the base 104 (e.g., atmospheric pressure) to be communicated into the interior 324 of each bellows 322 through each adapter 330. In an example, the pressure below the base 104 is greater than a pressure in the processing volume 150 of the processing chamber 100. In such an example, each bellows 322 biases each lift pin 114 upwards; each bellows 322 biases the (or each) lift plate 310 upwards; each bellows 322 biases the (or each) lift plate 310 towards the substrate support 112.

A rod 332 in each bellows 322 is coupled to the corresponding lift plate 310 disposed on each bellows 322. As illustrated, in some embodiments that may be combined with other embodiments, each rod 332 may be used to stabilize the lift plate 310 and lift pins 114 against lateral movement by a bearing 334. Each rod 332 extends through each corresponding adapter 330, and is coupled to a stop plate 336. In some embodiments that may be combined with other embodiments, a position of the stop plate 336 on the rod 332 is adjustable, such as by a screw thread. Each lift plate 310, rod 332, and stop plate 336 is configured to move vertically with respect to the base 104.

FIG. 3A shows the substrate support 112 in the lowered position. The bellows 322 bias the (or each) lift plate 310 upwards and against the reference surface 113A of the shoulder 113 of the substrate support 112. The bellows 322 bias the lift pins 114 towards an "up" position in which the upper ends 115 of the lift pins 114 protrude from the support surface 118 of the substrate support 112. Each stop plate 336 is not in contact with a stop surface 338 of the adapter 330. The carrier 170 with a substrate 154 resting on a lip 172 thereof is positioned above the substrate support 112, and out of contact with the substrate support assembly 300.

FIG. 3B shows the substrate support 112 in the intermediate position. The substrate support 112 has moved upwards from the lowered position. During movement of the substrate support 112 upwards from the lowered position to the intermediate position, the bellows 322 continue to bias the (or each) lift plate 310 upwards and against the shoulder 113 of the substrate support 112. Additionally, the bellows 322 continue to bias the lift pins 114 towards the "up" position. In such a manner, the substrate support 112 and the lift pins 114 are coupled such that the lift pins 114 move upwards simultaneously with the substrate support 112, and remain protruding from the support surface 118.

When the substrate support 112 is in the intermediate position, each stop plate 336 is in contact with the stop surface 338 of a corresponding adapter 330. The force exerted by any compression of bellows 322 and pressure acting on each of the bellows 322 on the (or each) lift plate 310 is communicated via each rod 332 to each stop plate 336. The bellows 322 bias each stop plate 336 into contact with each corresponding stop surface 338.

As illustrated, the lift pins 114 have lifted the substrate 154 off the carrier 170. In some embodiments that may be combined with other embodiments, an elevation of the carrier 170 within the processing chamber 100 is not changed while the substrate support 112 moves from the lowered position to the intermediate position. In some embodiments that may be combined with other embodiments, the lift pins 114 lift the substrate 154 off the carrier 170, and then the carrier 170 is removed from the processing chamber 100 before the substrate support 112 reaches the intermediate position. In some embodiments that may be combined with other embodiments, the carrier 170 is removed from the processing chamber 100 after confirming (such as by using the one or more sensors 166) that the lift pins 114 have lifted the substrate 154 off the carrier 170.

FIG. 3C shows the substrate support 112 in the raised position. The bellows 322 continue to bias the (or each) lift plate 310 upwards. The force exerted by each bellows 322 on the (or each) lift plate 310 is communicated via each rod 332 to each stop plate 336. The bellows 322 continue to bias each stop plate 336 into contact with each corresponding stop surface 338.

The biasing of each stop plate 336 against the corresponding stop surface 338 maintains each lift plate 310 and each lift pin 114 stationary with respect to the base 104. The substrate support 112 has moved upwards from the intermediate position. During movement of the substrate support 112 upwards from the intermediate position to the raised position, the reference surface 113A of the shoulder 113 of the substrate support 112 moves away from, and out of contact with, the (or each) lift plate 310. In such a manner, the substrate support 112 and the lift pins 114 are decoupled such that the lift pins 114 remain stationary while the substrate support 112 moves upwards from the intermediate position to the raised position. For example, the substrate support 112 moves upwards with respect to the floor 103 of the processing chamber 100, whereas the lift pins 114 do not move upwards or downwards with respect to the floor 103 of the processing chamber 100.

As illustrated, the lift pins 114 are in a "down" position with respect to the substrate support 112 such that the upper ends 115 of the lift pins 114 do not protrude from the support surface 118 of the substrate support 112. The substrate support 112 has lifted the substrate 154 off the lift pins 114. The substrate 154 is supported by the support surface 118 of the substrate support 112. The raised position of the substrate support 112 corresponds to a position of the substrate 154 when undergoing a processing operation in the processing chamber 100.

When the substrate support 112 is moved down from the raised position to the intermediate position, the lift pins 114 remain stationary. For example, the substrate support 112 moves downwards with respect to the floor 103 of the processing chamber 100, whereas the lift pins 114 do not move upwards or downwards with respect to the floor 103 of the processing chamber 100. As the substrate support 112 moves down near to the intermediate position, the lift pins 114 (while remaining stationary) protrude from the support surface 118, and lift the substrate 154 off the support surface 118. Then, the carrier 170 is positioned for receipt of the substrate 154, such as shown in FIG. 3B.

When the substrate support 112 arrives at the intermediate position from the raised position, the reference surface 113A of the shoulder 113 of the substrate support 112 engages the (or each) lift plate 310. When the substrate support 112 is moved down from the intermediate position to the lowered position, the (or each) lift plate 310 and the lift pins 114 move downward simultaneously with the substrate support 112. As the substrate support 112 moves down from the intermediate position to the lowered position, the lift pins 114 remain protruding from the support surface 118. The substrate 154 moves downwards on the lift pins 114 until the substrate 154 engages the lip 172 of the carrier 170. Further downward movement of the substrate support 112 and the lift pins 114 separates the substrate 154 from the lift pins 114, and the substrate 154 rests on the lip 172 of the carrier 170.

In some embodiments that may be combined with other embodiments, an elevation of the carrier 170 within the processing chamber 100 is not changed while the substrate support 112 moves from the intermediate position to the lowered position. In some embodiments that may be combined with other embodiments, the substrate 154 engages the lip 172 of the carrier 170, and then the carrier 170 and the substrate 154 are removed from the processing chamber 100 before the substrate support 112 reaches the lowered position. In some embodiments that may be combined with other embodiments, the carrier 170 and the substrate 154 are removed from the processing chamber 100 after confirming (such as by using the one or more sensors 166) that the lift pins 114 no longer support the substrate 154.

Figure 4A:
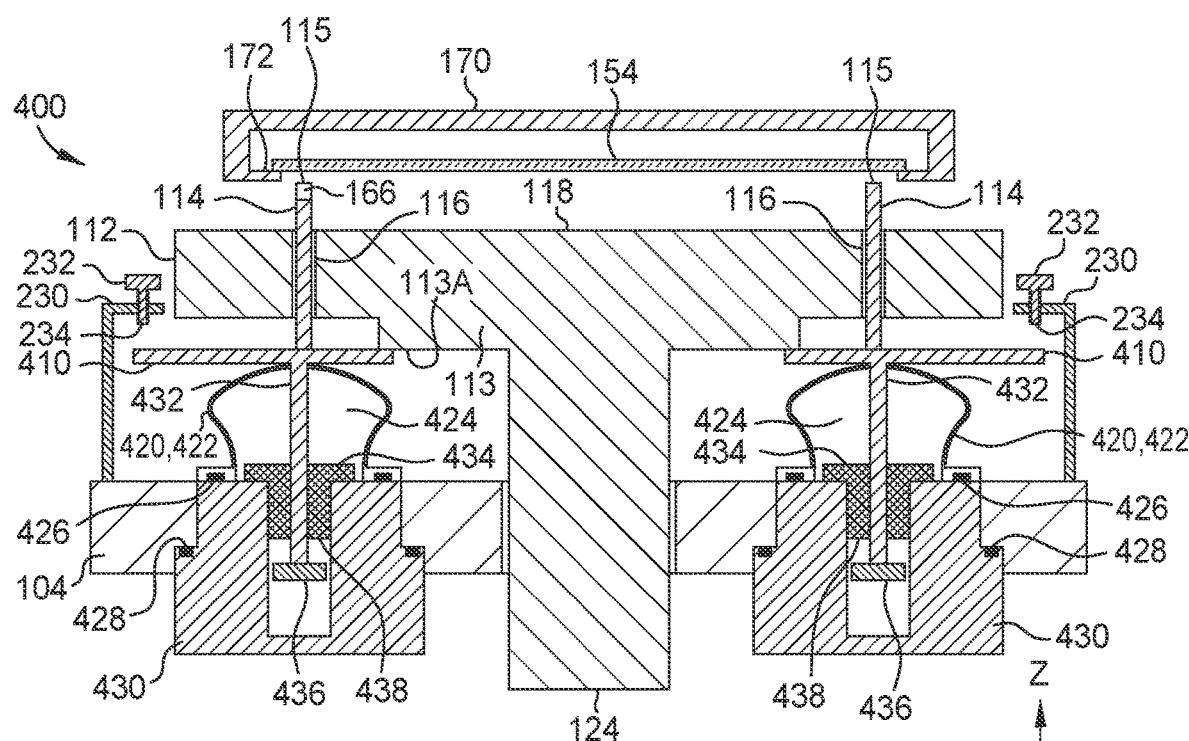
FIGS. 4A to 4C schematically illustrate another substrate support assembly that may be used in the processing chamber of FIG. 1.
Figure 4B:
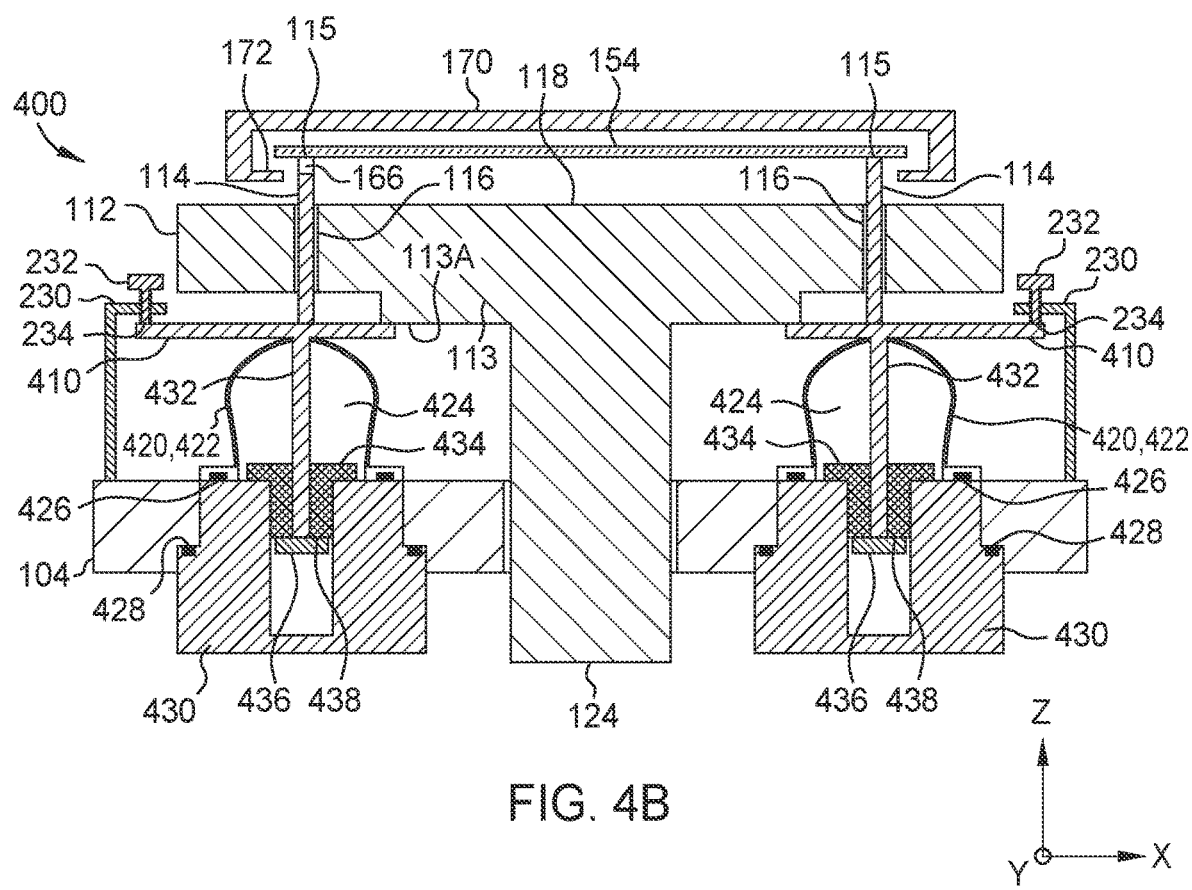
Figure 4C:
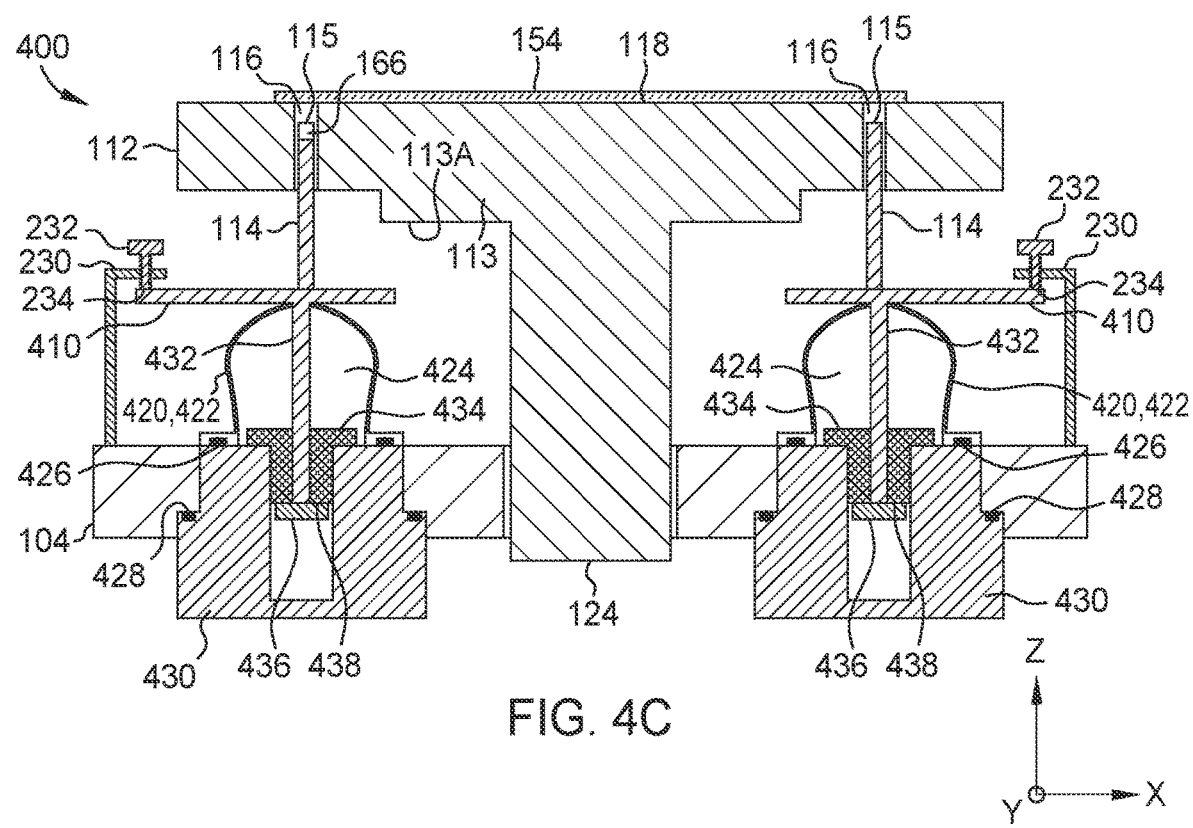

FIGS. 4A to 4C schematically illustrate substrate support assembly 400. The substrate support assembly 400 includes the substrate support 112 disposed on the shaft 124. The substrate support 112 is moveable between a raised position, a lowered position below the raised position, and an intermediate position between the raised and lowered positions. FIG. 4A shows the substrate support 112 in the lowered position; FIG. 4B shows the substrate support 112 in the intermediate position; and FIG. 4C shows the substrate support 112 in the raised position.

It is contemplated that the substrate support assembly 400 may include any one or more of the components, features, or aspects of the substrate support assembly 200 or 300, described above. The substrate support assembly 400 includes one or more different or additional components, features, or aspects, such as described below.

The substrate support assembly 400 includes one or more basing members 420. As illustrated, each biasing member 420 is a flexure 422. The flexure 422 is a dome including a metal, such as Inconel, brass, bronze, beryllium copper, nickel, Monel, or stainless steels. In some embodiments that may be combined with other embodiments, each biasing member 420 is a spring, such as spring 222, described above with respect to FIGS. 2A to 2C. In some embodiments that may be combined with other embodiments, each biasing member 420 is a bellows, such as bellows 322, described above with respect to FIGS. 3A to 3C.

In some embodiments that may be combined with other embodiments, the substrate support assembly 200 includes a plurality of flexures 422, such as two or more, three or more, four or more, five or more, or six or more flexures 422. It is contemplated that each flexure 422 may be disposed at a discrete location on the base 104 around the shaft 124.

In some embodiments that may be combined with other embodiments, the number of flexures 422 is less than the number of lift pins 114. In some embodiments that may be combined with other embodiments, the number of flexures 422 equals the number of lift pins 114. In some embodiments that may be combined with other embodiments, the number of flexures 422 is greater than the number of lift pins 114.

In some embodiments that may be combined with other embodiments, each flexure 422 is disposed below a separate lift plate 410. In some embodiments that may be combined with other embodiments, two or more flexures 422 are disposed below the same lift plate 410. In some embodiments that may be combined with other embodiments, every flexure 422 is disposed below the same lift plate 410. In some embodiments that may be combined with other embodiments, the (or each) lift plate 410 is integral with one or more of the flexures 422.

The flexures 422 bias each lift pin 114 upwards. The flexures 422 bias the (or each) lift plate 410 upwards. The flexures 422 bias the (or each) lift plate 410 towards the substrate support 112. As illustrated, in some embodiments that may be combined with other embodiments, the flexures 422 bias the (or each) lift plate 410 towards a corresponding stop plate 230, as described above with respect to the substrate support assembly 200. The stop plate 230 is coupled to the base 104. The stop plate 230 includes a lip, ledge, shoulder, or the like that provides a maximum extent of vertical travel of the (or each) lift plate 410 above the base 104. As described above, the stop plate 230 includes one or more adjustment mechanisms 232 that are configured to alter a distance between the base 104 and a contact point 234 of the stop plate 230 and a corresponding lift plate 410. In some embodiments that may be combined with other embodiments, the stop plate 230 may be omitted.

A rod 432 in each flexure 422 is coupled to the corresponding lift plate 410 disposed on each flexure 422. As illustrated, in some embodiments that may be combined with other embodiments, each rod 432 may be stabilized against lateral movement by a bearing 434. Each flexure 422 is mounted to the base 104 via an adapter 430. Each rod 432 extends into a corresponding adapter 430, and is coupled to a stop plate 436. In some embodiments that may be combined with other embodiments, a position of the stop plate 436 on the rod 432 is adjustable, such as by a screw thread. Each coupled lift plate 410, rod 432, and stop plate 436 is configured to move vertically with respect to the base 104.

In some embodiments that may be combined with other embodiments, each lift pin 114 is connected to each corresponding rod 432. In some examples, each lift pin 114 and rod 432 are in the form of a unitary member. In other examples, each lift pin 114 and rod 432 are in the form of separate members that are coupled together.

A seal 426 is between each flexure 422 and each corresponding adapter 430. Another seal 428 is between each adapter 430 and the base 104. As illustrated, each adapter 430 is closed such that a trapped volume of fluid is inside each combined adapter 430 and flexure 422. Each flexure 422 biases each corresponding lift plate 410 and lift pin 114 upwards by a combination of a spring bias of the material of the flexure 422 and a difference between the pressure of the trapped volume of fluid and the pressure in the processing volume 150 of the processing chamber 100. Each flexure 422 biases each corresponding lift plate 410 towards the substrate support 112.

In some embodiments that may be combined with other embodiments, each adapter 430 is not closed, such that a pressure below the base 104 is communicated into the interior of each flexure 422 through each adapter 430. In an example, the pressure below the base 104 is greater than a pressure in the processing volume 150 of the processing chamber 100. In such an example, each flexure 422 biases each lift pin 114 upwards; each flexure 422 biases the (or each) lift plate 410 upwards; each flexure 422 biases the (or each) lift plate 410 towards the substrate support 112.

FIG. 4A shows the substrate support 112 in the lowered position. The flexures 422 bias the (or each) lift plate 410 upwards and against the reference surface 113A of the shoulder 113 of the substrate support 112. The flexures 422 bias the lift pins 114 towards an "up" position in which the upper ends 115 of the lift pins 114 protrude from the support surface 118 of the substrate support 112. The (or each) lift plate 410 is not in contact with the stop plate 230. Each stop plate 436 is not in contact with a stop surface 438 of the adapter 430. The carrier 170 with a substrate 154 resting on a lip 172 thereof is positioned above the substrate support 112, and out of contact with the substrate support assembly 400.

FIG. 4B shows the substrate support 112 in the intermediate position. The substrate support 112 has moved upwards from the lowered position. During movement of the substrate support 112 upwards from the lowered position to the intermediate position, the flexures 422 continue to bias the (or each) lift plate 410 upwards and against the reference surface 113A of the shoulder 113 of the substrate support 112. Additionally, the flexures 422 continue to bias the lift pins 114 towards the "up" position. In such a manner, the substrate support 112 and the lift pins 114 are coupled such that the lift pins 114 move upwards simultaneously with the substrate support 112, and remain protruding from the support surface 118.

When the substrate support 112 is in the intermediate position, the (or each) lift plate 410 contacts the (or each) stop plate 230 (if present), such as at the corresponding adjustment mechanism 232. When the substrate support 112 is in the intermediate position, each stop plate 436 is in contact with the stop surface 438 of a corresponding adapter 430. The force exerted by each flexure 422 on the (or each) lift plate 410 is communicated via each rod 432 to each stop plate 436. The flexures 422 bias each stop plate 436 into contact with each corresponding stop surface 438.

As illustrated, the lift pins 114 have lifted the substrate 154 off the carrier 170. In some embodiments that may be combined with other embodiments, an elevation of the carrier 170 within the processing chamber 100 is not changed while the substrate support 112 moves from the lowered position to the intermediate position. In some embodiments that may be combined with other embodiments, the lift pins 114 lift the substrate 154 off the carrier 170, and then the carrier 170 is removed from the processing chamber 100 before the substrate support 112 reaches the intermediate position. In some embodiments that may be combined with other embodiments, the carrier 170 is removed from the processing chamber 100 after confirming (such as by using the one or more sensors 166) that the lift pins 114 have lifted the substrate 154 off the carrier 170.

FIG. 4C shows the substrate support 112 in the raised position. The flexures 422 continue to bias the (or each) lift plate 410 upwards. The force exerted by each flexure 422 on the (or each) lift plate 410 is communicated via each rod 432 to each stop plate 436. The flexures 422 continue to bias each stop plate 436 into contact with each corresponding stop surface 438. In embodiments in which one or more stop plate 230 is present, the flexures 422 continue to bias the (or each) lift plate 410 upwards and against the (or each) stop plate 230.

The biasing of each stop plate 436 against the corresponding stop surface 438 maintains each lift plate 410 and each lift pin 114 stationary with respect to the base 104. The substrate support 112 has moved upwards from the intermediate position. During movement of the substrate support 112 upwards from the intermediate position to the raised position, the shoulder 113 of the substrate support 112 moves away from, and out of contact with, the (or each) lift plate 410. In such a manner, the substrate support 112 and the lift pins 114 are decoupled such that the lift pins 114 remain stationary while the substrate support 112 moves upwards from the intermediate position to the raised position. For example, the substrate support 112 moves upwards with respect to the floor 103 of the processing chamber 100, whereas the lift pins 114 do not move upwards or downwards with respect to the floor 103 of the processing chamber 100.

As illustrated, the lift pins 114 are in a "down" position with respect to the substrate support 112 such that the upper ends 115 of the lift pins 114 do not protrude from the support surface 118 of the substrate support 112. The substrate support 112 has lifted the substrate 154 off the lift pins 114. The substrate 154 is supported by the support surface 118 of the substrate support 112. The raised position of the substrate support 112 corresponds to a position of the substrate 154 when undergoing a processing operation in the processing chamber 100.

When the substrate support 112 is moved down from the raised position to the intermediate position, the lift pins 114 remain stationary. For example, the substrate support 112 moves downwards with respect to the floor 103 of the processing chamber 100, whereas the lift pins 114 do not move upwards or downwards with respect to the floor 103 of the processing chamber 100. As the substrate support 112 moves down near to the intermediate position, the lift pins 114 (while remaining stationary) protrude from the support surface 118, and lift the substrate 154 off the support surface 118. Then, the carrier 170 is positioned for receipt of the substrate 154, such as shown in FIG. 4B.

When the substrate support 112 arrives at the intermediate position from the raised position, the shoulder 113 of the substrate support 112 engages the (or each) lift plate 410. When the substrate support 112 is moved down from the intermediate position to the lowered position, the (or each) lift plate 410 and the lift pins 114 move downward simultaneously with the substrate support 112. As the substrate support 112 moves down from the intermediate position to the lowered position, the lift pins 114 remain protruding from the support surface 118. The substrate 154 moves downwards on the lift pins 114 until the substrate 154 engages the lip 172 of the carrier 170. Further downward movement of the substrate support 112 and the lift pins 114 separates the substrate 154 from the lift pins 114, and the substrate 154 rests on the lip 172 of the carrier 170.

In some embodiments that may be combined with other embodiments, an elevation of the carrier 170 within the processing chamber 100 is not changed while the substrate support 112 moves from the intermediate position to the lowered position. In some embodiments that may be combined with other embodiments, the substrate 154 engages the lip 172 of the carrier 170, and then the carrier 170 and the substrate 154 are removed from the processing chamber 100 before the substrate support 112 reaches the lowered position. In some embodiments that may be combined with other embodiments, the carrier 170 and the substrate 154 are removed from the processing chamber 100 after confirming (such as by using the one or more sensors 166) that the lift pins 114 no longer support the substrate 154.

Figure 5A:
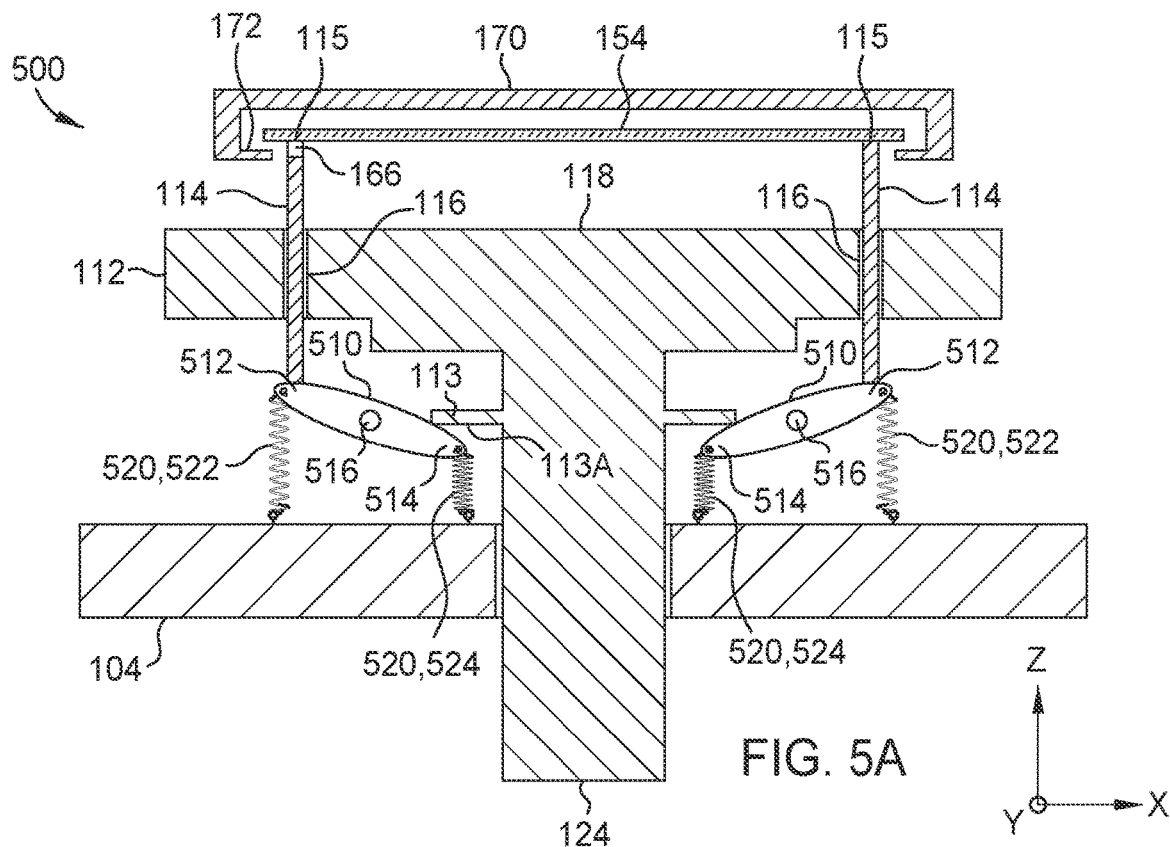
FIGS. 5A to 5C schematically illustrate another substrate support assembly that may be used in the processing chamber of FIG. 1.
Figure 5B:
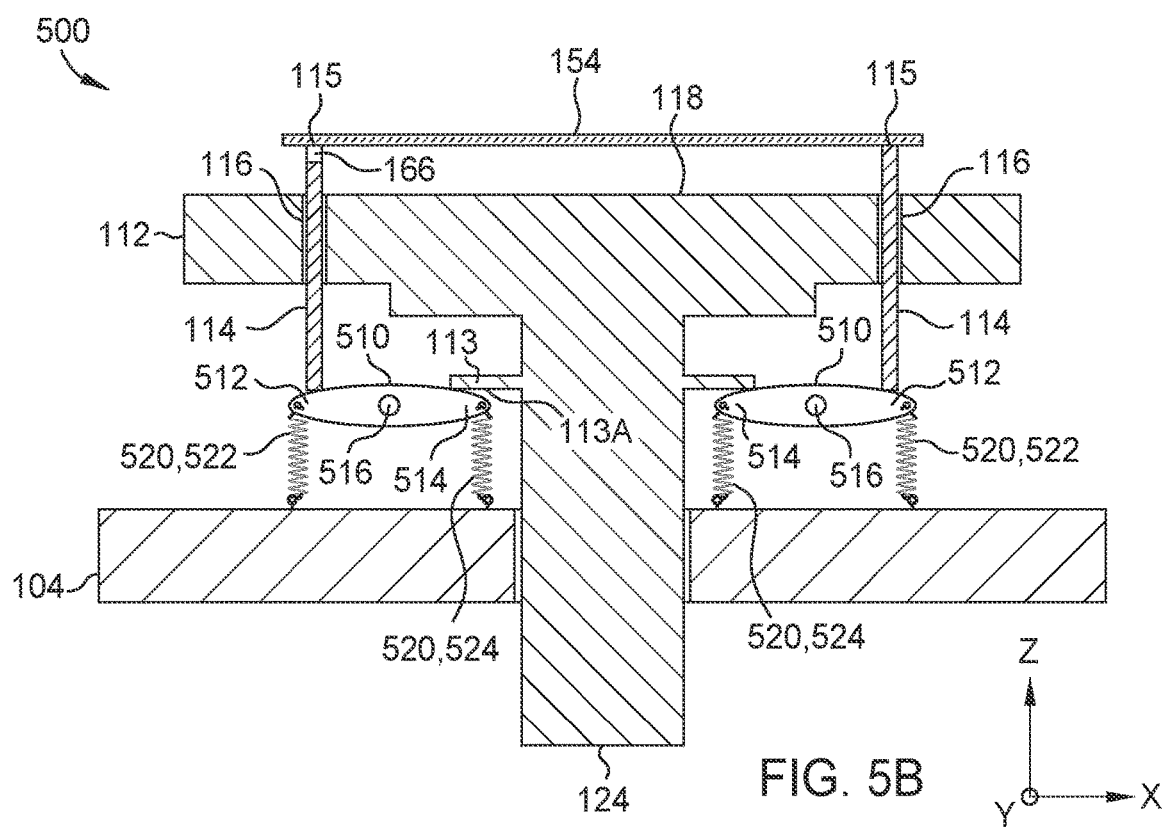
Figure 5C:
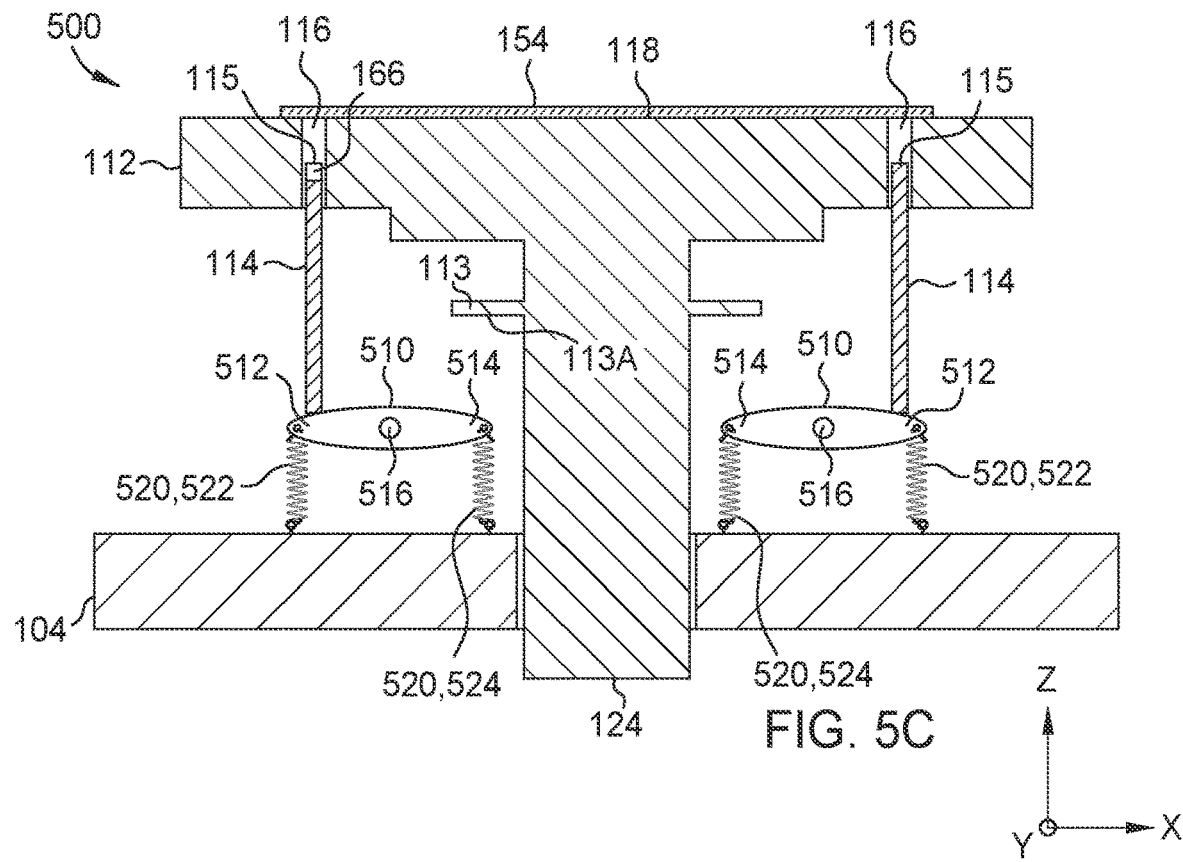

FIGS. 5A to 5C schematically illustrate substrate support assembly 500. The substrate support assembly 500 includes the substrate support 112 disposed on the shaft 124. The substrate support 112 is moveable between a raised position, a lowered position below the raised position, and an intermediate position between the raised and lowered positions. FIG. 5A shows the substrate support 112 in the lowered position; FIG. 5B shows the substrate support 112 in the intermediate position; and FIG. 5C shows the substrate support 112 in the raised position.

It is contemplated that the substrate support assembly 500 may include any one or more of the components, features, or aspects of the substrate support assembly 200, 300, or 400, described above. The substrate support assembly 500 includes one or more different or additional components, features, or aspects, such as described below.

The lift pins 114 of the substrate support assembly 500 are cam-actuated. Each lift pin 114 is disposed on a first side 512 of a corresponding cam 510. A shoulder 113 of the substrate support 112 is moveable into and out of contact with a second side 514 of each cam 510. Each cam 510 includes a pivot between the first side 512 and the second side 514.

Each cam 510 is biased towards a neutral position. As illustrated (such as in FIG. 5C), in some embodiments that may be combined with other embodiments, each cam 510 is substantially horizontal when in the neutral position. In some alternative embodiments that may be combined with other embodiments, the first side 512 is elevated with respect to the second side 514 when each cam 510 is in the neutral position. In some further alternative embodiments that may be combined with other embodiments, the second side 514 is elevated with respect to the first side 512 when each cam 510 is in the neutral position.

Each cam 510 is biased by one or more biasing members 520, such as springs. As illustrated, a first spring 522 is coupled to the first side 512 of each cam 510 and to the base 104, and a second spring 524 is coupled to the second side 514 of each cam 510 and to the base 104. For each cam 510, the first spring 522 biases the cam 510 to rotate about the pivot in one direction (either clockwise or anticlockwise), and the second spring 524 biases the cam 510 to rotate about the pivot in the opposite direction (either anticlockwise or clockwise). Each of the first spring 522 and second spring 524 may be a tension spring or a compression spring. Additionally, or alternatively, the biasing members 520 may include one or more torsion springs.

FIG. 5A shows the substrate support 112 in the lowered position. The shoulder 113 of the substrate support 112 is in contact with the second side 514 of each cam 510, and holds each second side 514 in a "down" position. The first side 512 of each cam 510 is in an "up" position. Each lift pin 114 disposed on a corresponding first side 512 of each cam 510 is in an "up" position in which the upper end 115 of each lift pin 114 protrudes from the support surface 118 of the substrate support 112.

The carrier 170 with a substrate 154 is positioned above the substrate support 112. As illustrated, the lift pins 114 have lifted the substrate 154 off the lip 172 of the carrier 170. In some embodiments that may be combined with other embodiments, an elevation of the carrier 170 within the processing chamber 100 is not changed while the substrate support 112 moves downwards to the lowered position. In some embodiments that may be combined with other embodiments, the lift pins 114 lift the substrate 154 off the carrier 170, and then the carrier 170 is removed from the processing chamber 100 before the substrate support 112 is moved towards the intermediate position (FIG. 5B). In some embodiments that may be combined with other embodiments, the carrier 170 is removed from the processing chamber 100 after confirming (such as by using the one or more sensors 166) that the lift pins 114 have lifted the substrate 154 off the carrier 170.

FIG. 5B shows the substrate support 112 in the intermediate position. The substrate support 112 has moved upwards from the lowered position, and each cam 510 has moved towards the neutral position under the influence of each first spring 522 and second spring 524. During movement of the substrate support 112 upwards from the lowered position to the intermediate position, the second side 514 of each cam 510 moves upwards under the influence of each first spring 522. While the second side 514 moves upwards, the first side 512 of each cam 510 moves downwards. Each lift pin 114 disposed on a corresponding first side 512 of each cam 510 moves downwards. In such a manner, the substrate support 112 and the lift pins 114 are coupled such that the lift pins 114 move simultaneously with the substrate support 112. When the substrate support 112 moves upwards with respect to the base 104 from the lowered position to the intermediate position, the lift pins 114 move downwards with respect to the base 104.

As illustrated, in some embodiments that may be combined with other embodiments, when the substrate support 112 is in the intermediate position, the lift pins 114 remain protruding from the support surface 118. The substrate 154 is supported on the lift pins 114. Nevertheless, in some alternative embodiments that may be combined with other embodiments, when the substrate support 112 transitions from the lowered position to the intermediate position, the upper ends 115 of the lift pins 114 move down below the level of the support surface 118, and the substrate 154 is transferred from the lift pins 114 to the support surface 118.

FIG. 5C shows the substrate support 112 in the raised position. The substrate support 112 has moved upwards from the intermediate position. During movement of the substrate support 112 upwards from the intermediate position to the raised position, the shoulder 113 of the substrate support 112 moves away from, and out of contact with, the second side 514 of each cam 510. Each cam 510 remains in the neutral position, and each lift pin 114 remains disposed on each corresponding first side 512 of a corresponding cam 510. In such a manner, the substrate support 112 and the lift pins 114 are decoupled such that the lift pins 114 remain stationary while the substrate support 112 moves upwards from the intermediate position to the raised position. For example, the substrate support 112 moves upwards with respect to the floor 103 of the processing chamber 100, whereas the lift pins 114 do not move upwards or downwards with respect to the floor 103 of the processing chamber 100.

As illustrated, the lift pins 114 are in a "down" position with respect to the substrate support 112 such that the upper ends 115 of the lift pins 114 do not protrude from the support surface 118 of the substrate support 112. The substrate support 112 has lifted the substrate 154 off the lift pins 114. The substrate 154 is supported by the support surface 118 of the substrate support 112. The raised position of the substrate support 112 corresponds to a position of the substrate 154 when undergoing a processing operation in the processing chamber 100.

When the substrate support 112 is moved down from the raised position to the intermediate position, the lift pins 114 remain stationary. For example, the substrate support 112 moves downwards with respect to the floor 103 of the processing chamber 100, whereas the lift pins 114 do not move upwards or downwards with respect to the floor 103 of the processing chamber 100. In the illustrated embodiment, as the substrate support 112 moves down near to the intermediate position, the lift pins 114 (while remaining stationary) protrude from the support surface 118, and lift the substrate 154 off the support surface 118. However, in some alternative embodiments that may be combined with other embodiments, the lift pins 114 (while remaining stationary) do not protrude from the support surface 118, and the substrate 154 remains on the support surface 118 when the substrate support 112 is in the intermediate position.

When the substrate support 112 arrives at the intermediate position from the raised position, the shoulder 113 of the substrate support 112 engages the second side 514 of each cam 510. When the substrate support 112 is moved down from the intermediate position to the lowered position, the shoulder 113 of the substrate support 112 pushes each second side 514 towards the "down" position. Each cam 510 rotates about the pivot, moving the first side 512 of each cam 510 towards the "up" position. Each lift pin 114 disposed on a corresponding first side 512 of each cam 510 moves upwards. In such a manner, the substrate support 112 and the lift pins 114 are coupled such that the lift pins 114 move simultaneously with the substrate support 112. When the substrate support 112 moves downwards with respect to the base 104 from the intermediate position to the lowered position, the lift pins 114 move upwards with respect to the base 104.

In embodiments in which the upper ends 115 of the lift pins 114 do not protrude from the support surface 118 when the substrate support 112 is in the intermediate position, moving the substrate support 112 downwards from the intermediate position to the lowered position results in the upper ends 115 of the lift pins 114 rising above the level of the support surface 118. In so doing, the lift pins 114 lift the substrate 154 off the support surface 118.

When the substrate support arrives at the lowered position, the upper ends 115 of the lift pins 114 are positioned at a maximum elevation within the processing chamber 100. The carrier 170 can be positioned to receive the substrate 154. In some embodiments that may be combined with other embodiments, the carrier 170 is moved vertically to lift the substrate 154 off the lift pins 114.

In some embodiments that may be combined with other embodiments, an elevation of the carrier 170 within the processing chamber 100 is not changed while receiving the substrate 154. In an example, after positioning the carrier 170 for receipt of the substrate 154, the substrate support 112 is moved upwards at least part-way from the lowered position towards the intermediate position. While the substrate support 112 moves upwards, the lift pins 114 move downwards and deposit the substrate 154 onto the lip 172 of the carrier 170. Then the carrier 170 and the substrate 154 are removed from the processing chamber 100. In some embodiments that may be combined with other embodiments, the carrier 170 and the substrate 154 are removed from the processing chamber 100 after confirming (such as by using the one or more sensors 166) that the lift pins 114 no longer support the substrate 154.

Figure 6A:
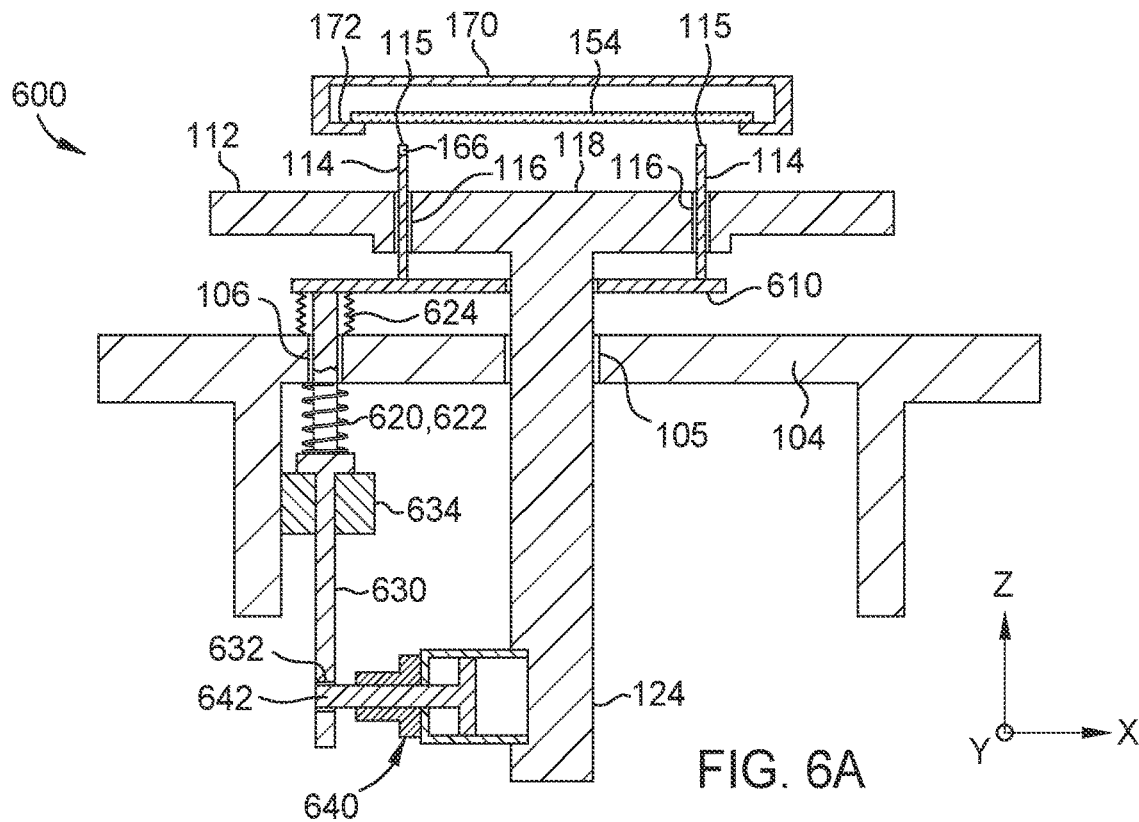
FIGS. 6A to 6C schematically illustrate another substrate support assembly that may be used in the processing chamber of FIG. 1.
Figure 6B:
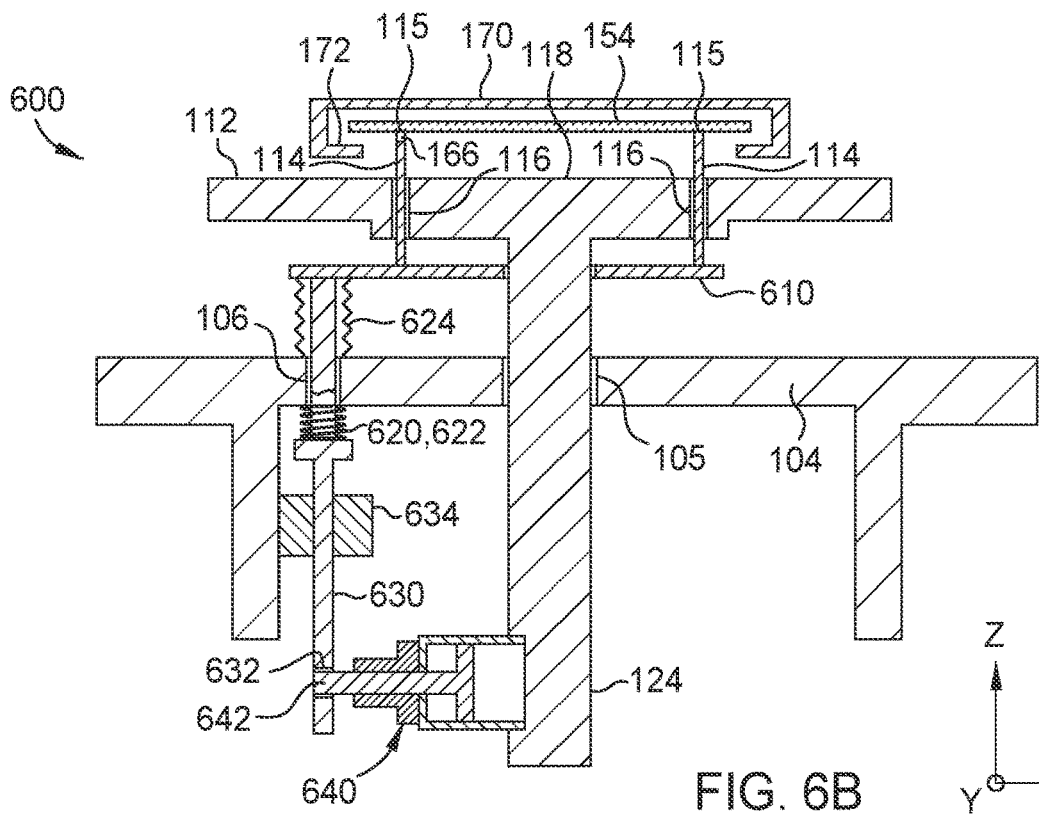
Figure 6C:
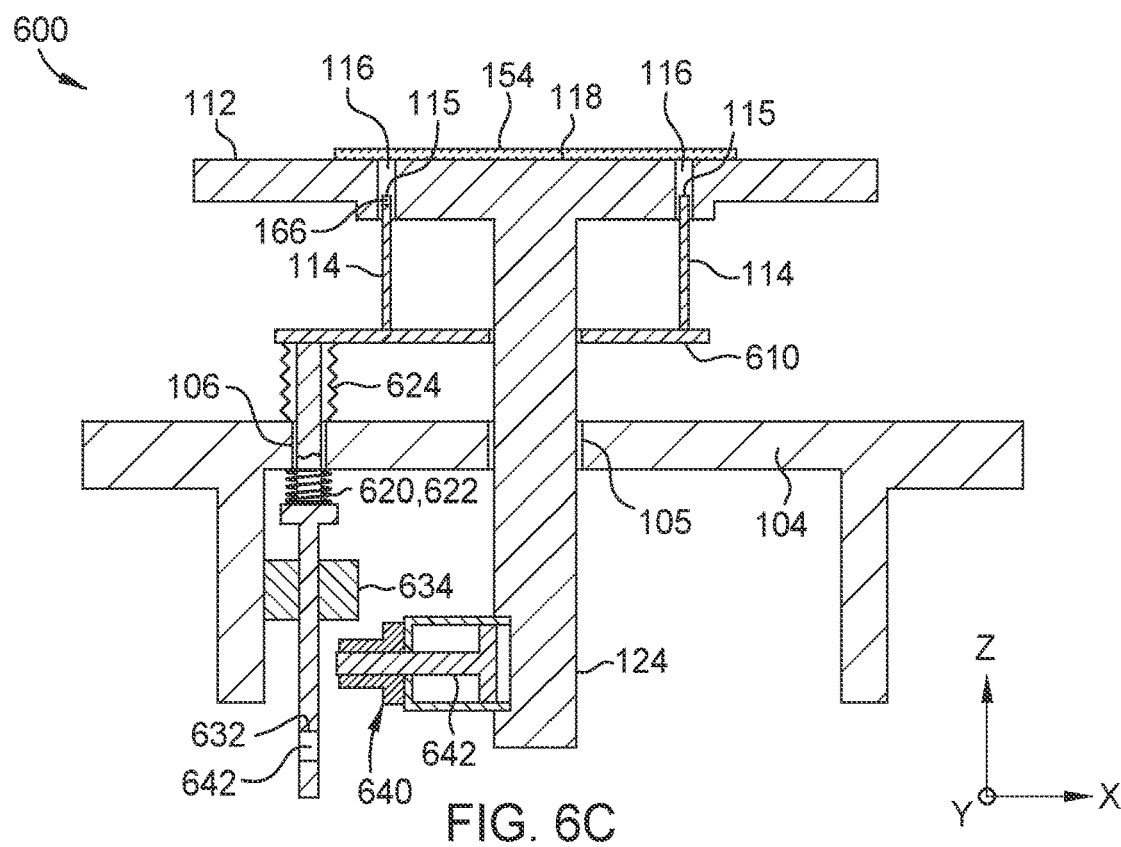

FIGS. 6A to 6C schematically illustrate substrate support assembly 600. The substrate support assembly 600 includes the substrate support 112 disposed on the shaft 124. The substrate support 112 is moveable between a raised position, a lowered position below the raised position, and an intermediate position between the raised and lowered positions. FIG. 6A shows the substrate support 112 in the lowered position; FIG. 6B shows the substrate support 112 in the intermediate position; and FIG. 6C shows the substrate support 112 in the raised position.

The shaft 124 of the substrate support assembly 600 extends through an aperture 105 in the base 104. A connecting rod 630 located next to the shaft 124 extends through another aperture 106 in the base 104. A lock 640 selectively couples the shaft 124 with the connecting rod 630. In some embodiments that may be combined with other embodiments, the lock includes a locking bolt 642 that selectively engages with an aperture 632 in the connecting rod 630.

In some embodiments that may be combined with other embodiments, fluid pressure (pneumatic or hydraulic) moves the locking bolt 642 into engagement with the connecting rod 630 and/or moves the locking bolt 642 out of engagement with the connecting rod 630. In some examples, a first fluid pressure is applied to the lock 640 to move the locking bolt 642 into engagement with the connecting rod 630, and a second fluid pressure is applied to the lock 640 to move the locking bolt 642 out of engagement with the connecting rod 630. In some examples, the locking bolt 642 is biased into engagement with the connecting rod 630, and a fluid pressure is applied to move the locking bolt 642 out of engagement with the connecting rod 630. In some examples, the locking bolt 642 is biased out of engagement with the connecting rod 630, and a fluid pressure is applied to move the locking bolt 642 into engagement with the connecting rod 630.

In some embodiments that may be combined with other embodiments, the lock 640 includes a solenoid, and an electric current applied to the solenoid moves the locking bolt 642 into engagement with the connecting rod 630 and/or moves the locking bolt 642 out of engagement with the connecting rod 630. In some examples, a first electric current is applied to the solenoid to move the locking bolt 642 into engagement with the connecting rod 630, and a second electric current is applied to the solenoid to move the locking bolt 642 out of engagement with the connecting rod 630. In some examples, the solenoid is biased into engagement with the connecting rod 630, and an electric current is applied to the solenoid to move the locking bolt 642 out of engagement with the connecting rod 630. In some examples, the solenoid is biased out of engagement with the connecting rod 630, and an electric current is applied to the solenoid to move the locking bolt 642 into engagement with the connecting rod 630.

In some embodiments that may be combined with other embodiments, the lock 640 includes an electromagnet that selectively magnetically couples the shaft 124 with the connecting rod 630, but the locking bolt 642 is omitted. In an example, the electromagnet does not mechanically couple the shaft 124 with the connecting rod 630, but the electromagnet is energized in order to magnetically couple the shaft 124 with the connecting rod 630.

In some embodiments that may be combined with other embodiments, the lock 640 includes an electromagnet that selectively magnetically couples the shaft 124 with the connecting rod 630, and the locking bolt 642 is present. In an example, energizing the electromagnet moves the locking bolt 642 into engagement with the connecting rod 630, and also magnetically couples the shaft 124 with the connecting rod 630.

The connecting rod 630 is moveable vertically. A guide or bearing 634 inhibits lateral movement of the connecting rod 630. As illustrated, in some embodiments that may be combined with other embodiments, the connecting rod 630 is biased downwards by a biasing member 620, such as a spring 622. In some embodiments that may be combined with other embodiments, the biasing member 620 is omitted. The connecting rod 630 passes through a bellows 624 on the base 104. The bellows 624 may be configured similarly to the bellows 322, described above.

The connecting rod 630 is attached to the top of the bellows 624. In some embodiments that may be combined with other embodiments, the bellows 624 is selectively pressurized to impart an upwards biasing force on the connecting rod 630.

A lift plate 610 is disposed at the top of the bellows 624. It is contemplated that the lift plate 610 may form a ring or a partial ring that at least partially encircles the shaft 124. Lift pins 114 are disposed on the lift plate 610. In some embodiments that may be combined with other embodiments, the substrate support assembly 600 includes three lift pins 114. In some embodiments that may be combined with other embodiments, the substrate support assembly 600 includes more than three lift pins 114, such as four or more, five or more, or six or more lift pins 114. Each lift pin 114 is disposed through a corresponding hole 116 in the substrate support 112.

FIG. 6A shows the substrate support 112 in the lowered position. The lock 640 has been activated to couple the connecting rod 630 (physically and/or magnetically) with the shaft 124. The connecting rod 630, the top of the bellows 624, the lift plate 610, and the lift pins 114 are depicted as being at a low position with respect to the base 104. The upper ends 115 of the lift pins 114 protrude from the support surface 118 of the substrate support 112. The carrier 170 with a substrate 154 resting on a lip 172 thereof is positioned above the substrate support 112, and out of contact with the substrate support assembly 600.

FIG. 6B shows the substrate support 112 in the intermediate position. The substrate support 112 has moved upwards from the lowered position. During movement of the substrate support 112 upwards from the lowered position to the intermediate position, the shaft 124 moves upwards. Upward movement of the shaft 124 causes upward movement of the connecting rod 630 via the coupling effected by the lock 640. Upward movement of the connecting rod 630 causes upward movement of the top of the bellows 624, the lift plate 610, and the lift pins 114. In such a manner, the substrate support 112 and the lift pins 114 are coupled such that the lift pins 114 move upwards simultaneously with the substrate support 112, and remain protruding from the support surface 118. The connecting rod 630, the top of the bellows 624, the lift plate 610, and the lift pins 114 are depicted as being at a high position with respect to the base 104.

As illustrated, the lift pins 114 have lifted the substrate 154 off the carrier 170. In some embodiments that may be combined with other embodiments, an elevation of the carrier 170 within the processing chamber 100 is not changed while the substrate support 112 moves from the lowered position to the intermediate position. In some embodiments that may be combined with other embodiments, the lift pins 114 lift the substrate 154 off the carrier 170, and then the carrier 170 is removed from the processing chamber 100 before the substrate support 112 reaches the intermediate position. In some embodiments that may be combined with other embodiments, the carrier 170 is removed from the processing chamber 100 after confirming (such as by using the one or more sensors 166) that the lift pins 114 have lifted the substrate 154 off the carrier 170. After the carrier 170 is removed from the processing chamber 100, the lock 640 is deactivated to decouple the connecting rod 630 from the shaft 124.

FIG. 6C shows the substrate support 112 in the raised position. The lock 640 has been deactivated to decouple the connecting rod 630 from the shaft 124 before moving the substrate support 112 from the intermediate position to the raised position. Decoupling the connecting rod 630 from the shaft 124 results in upward movement of the substrate support 112 and the shaft 124 between the intermediate and raised positions being independent of the connecting rod 630. The connecting rod 630, the lift plate 610, and the lift pins 114 disposed on the lift plate 610 do not move upward. In such a manner, the substrate support 112 and the lift pins 114 are decoupled such that the lift pins 114 remain stationary while the substrate support 112 moves upwards from the intermediate position to the raised position. For example, the substrate support 112 moves upwards with respect to the floor 103 of the processing chamber 100, whereas the lift pins 114 do not move upwards or downwards with respect to the floor 103 of the processing chamber 100.

As illustrated, the lift pins 114 are in a "down" position with respect to the substrate support 112 such that the upper ends 115 of the lift pins 114 do not protrude from the support surface 118 of the substrate support 112. The substrate support 112 has lifted the substrate 154 off the lift pins 114. The substrate 154 is supported by the support surface 118 of the substrate support 112. The raised position of the substrate support 112 corresponds to a position of the substrate 154 when undergoing a processing operation in the processing chamber 100.

In some embodiments that may be combined with other embodiments, a pressure is applied to the bellows 624 in order to maintain the connecting rod 630 in the high position.

When the substrate support 112 is moved down from the raised position to the intermediate position, the lift pins 114 remain stationary. For example, the substrate support 112 moves downwards with respect to the floor 103 of the processing chamber 100, whereas the lift pins 114 do not move upwards or downwards with respect to the floor 103 of the processing chamber 100. As the substrate support 112 moves down near to the intermediate position, the lift pins 114 (while remaining stationary) protrude from the support surface 118, and lift the substrate 154 off the support surface 118. Then, the carrier 170 is positioned for receipt of the substrate 154, such as shown in FIG. 4B.

After the substrate support 112 arrives at the intermediate position from the raised position, the lock 640 is activated to couple the connecting rod 630 (physically and/or magnetically) with the shaft 124. When the substrate support 112 is moved down from the intermediate position to the lowered position, the connecting rod 630, the lift plate 610, and the lift pins 114 move downward simultaneously with the substrate support 112. In embodiments in which a pressure had been applied to the bellows 624, the pressure is released in order to facilitate downward movement of the connecting rod 630 with the shaft 124.

As the substrate support 112 moves down from the intermediate position to the lowered position, the lift pins 114 remain protruding from the support surface 118. The substrate 154 moves downwards on the lift pins 114 until the substrate 154 engages the lip 172 of the carrier 170. Further downward movement of the substrate support 112 and the lift pins 114 separates the substrate 154 from the lift pins 114, and the substrate 154 rests on the lip 172 of the carrier 170.

In some embodiments that may be combined with other embodiments, an elevation of the carrier 170 within the processing chamber 100 is not changed while the substrate support 112 moves from the intermediate position to the lowered position. In some embodiments that may be combined with other embodiments, the substrate 154 engages the lip 172 of the carrier 170, and then the carrier 170 and the substrate 154 are removed from the processing chamber 100 before the substrate support 112 reaches the lowered position. In some embodiments that may be combined with other embodiments, the carrier 170 and the substrate 154 are removed from the processing chamber 100 after confirming (such as by using the one or more sensors 166) that the lift pins 114 no longer support the substrate 154.

In some embodiments that may be combined with other embodiments, in any of the substrate support assemblies 110, 200, 300, 400, 500, or 600 disclosed herein, the lift pins 114 are not disposed though holes 116 in the substrate support 112, but instead are disposed around an outer edge of the substrate support 112. In some embodiments that may be combined with other embodiments, in any of the substrate support assemblies 110, 200, 300, 400, 500, or 600 disclosed herein, the holes 116 in the substrate support 112 are configured as recesses around the outer edge of the substrate support 112, and the lift pins 114 are disposed in the recesses.

Figure 7:
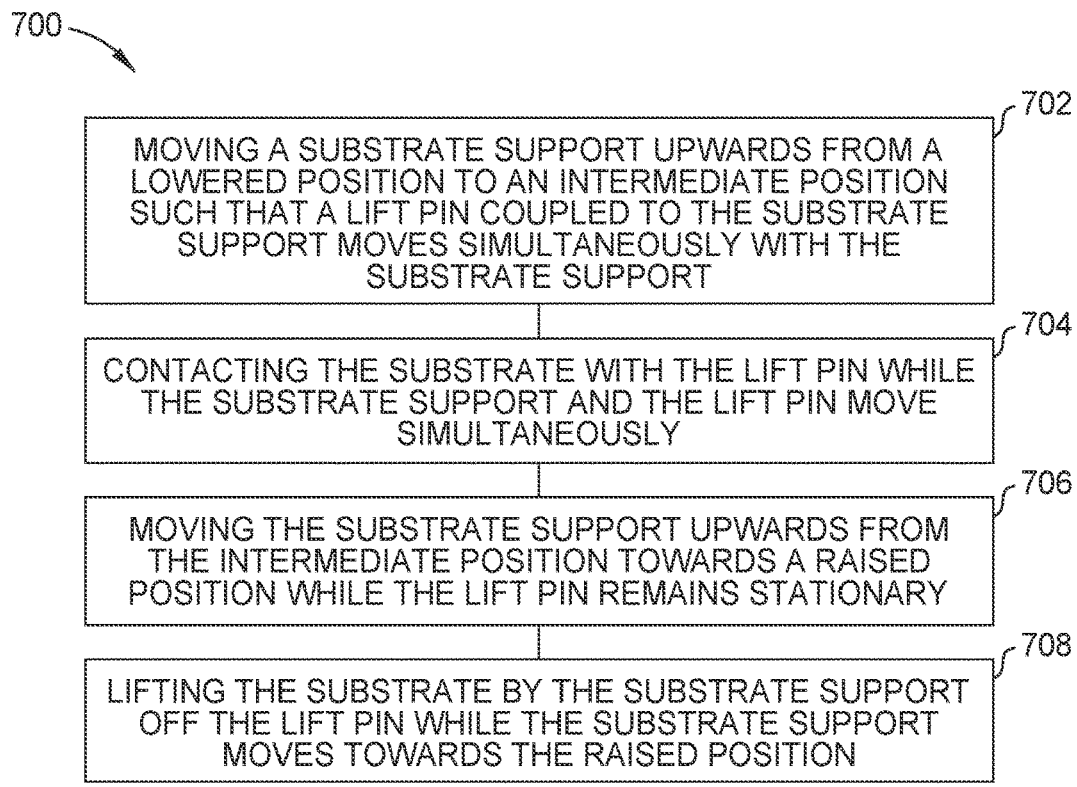
FIG. 7 is a flowchart of a method of using any of the substrate support assemblies of FIGS. 2A to 6C.

FIG. 7 is a flowchart of a method 700 of manipulating a substrate. The method 700 may be performed using any of substrate support assembly 110, 200, 300, 400, 500, or 600.

Operation 702 involves moving a substrate support upwards from a lowered position to an intermediate position such that a lift pin coupled to the substrate support moves simultaneously with the substrate support. In some embodiments, the lift pin moves upwards simultaneously with the substrate support, such as with substrate support assembly 200, 300, 400, or 600. In some embodiments, the lift pin moves downwards while the substrate support simultaneously moves upwards, such as with substrate support assembly 500.

Operation 704 involves contacting the substrate with the lift pin while the substrate support and the lift pin move simultaneously. In some embodiments, operation 704 occurs before operation 702, such as with substrate support assembly 500. In some embodiments, operation 704 occurs during operation 702, such as with substrate support assembly 200, 300, 400, or 600. In some embodiments that may be combined with other embodiments, the method 700 further includes using a sensor on the lift pin to detect one of: a presence of the substrate on the lift pin; or a temperature of the substrate.

In some embodiments that may be combined with other embodiments, the method 700 further includes using the lift pin to lift the substrate off a carrier. In some embodiments that may be combined with other embodiments, the method 700 is conducted in a processing chamber, and the method 700 further includes removing the carrier from the processing chamber.

Operation 706 involves moving the substrate support upwards from the intermediate position towards a raised position while the lift pin remains stationary. For example, the substrate support moves upwards with respect to the floor of the processing chamber, whereas the lift pins do not move upwards or downwards with respect to the floor of the processing chamber.

Operation 708 involves lifting the substrate by the substrate support off the lift pin while the substrate support moves towards the raised position.

In some embodiments that may be combined with other embodiments, the method 700 further includes moving the substrate support downwards from the raised position towards the intermediate position while the lift pin remains stationary. For example, the substrate support moves downwards with respect to the floor of the processing chamber, whereas the lift pins do not move upwards or downwards with respect to the floor of the processing chamber. In some embodiments that may be combined with other embodiments, the method 700 further includes contacting the substrate with the lift pin while moving the substrate support downwards towards the intermediate position. In some embodiments that may be combined with other embodiments, the method 700 further includes lifting the substrate off the substrate support by the lift pin while moving the substrate support downwards towards the intermediate position.

In some embodiments that may be combined with other embodiments, the method 700 further includes moving the substrate support downwards from the intermediate position towards the lowered position such that the lift pin moves simultaneously with movement of the substrate support. In some embodiments that may be combined with other embodiments, the method 700 further includes transferring the substrate from the lift pin to a carrier while moving the lift pin downwards towards the lowered position.

Figure 8:
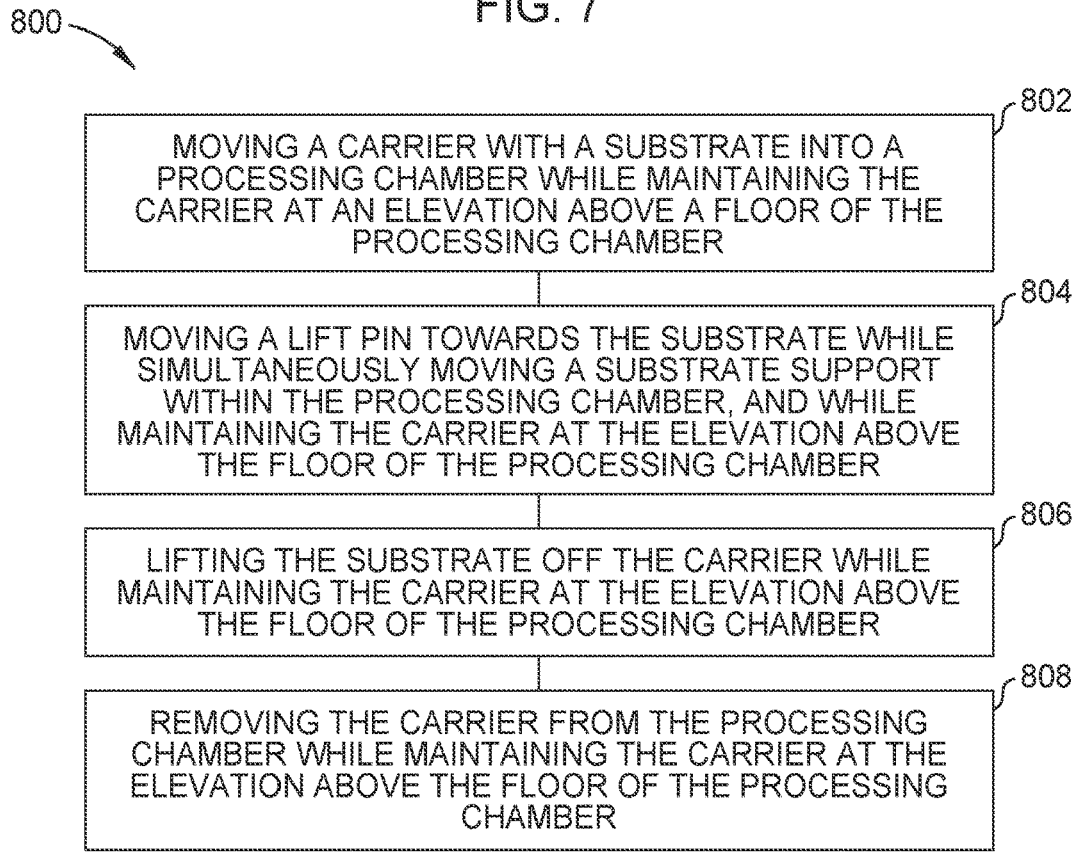
FIG. 8 is a flowchart of a method of using any of the substrate support assemblies of FIGS. 2A to 6C.

FIG. 8 is a flowchart of a method 800 of manipulating a substrate. The method 800 may be performed using any of substrate support assembly 110, 200, 300, 400, 500, or 600.

Operation 802 involves moving a carrier with a substrate into a processing chamber while maintaining the carrier at an elevation above a floor of the processing chamber.

Operation 804 involves moving a lift pin towards the substrate while simultaneously moving a substrate support within the processing chamber, and while maintaining the carrier at the elevation above the floor of the processing chamber.

Operation 806 involves lifting the substrate off the carrier while maintaining the carrier at the elevation above the floor of the processing chamber.

Operation 808 involves removing the carrier from the processing chamber while maintaining the carrier at the elevation above the floor of the processing chamber.

The method 700 may incorporate any operation or aspect of the method 800. The method 800 may incorporate any operation or aspect of the method 700.

Embodiments of the present disclosure facilitate the transfer of a substrate between a carrier and a substrate support without changing an elevation of the carrier within a processing chamber. Embodiments of the present disclosure facilitate the actuation of lift pins by using motion of a substrate support. Embodiments of the present disclosure facilitate the actuation of lift pins such that the lift pins contact the substrate simultaneously, and raise or lower the substrate.

It is contemplated that any one or more elements or features of any one disclosed embodiment may be beneficially incorporated in any one or more other non-mutually exclusive embodiments. While the foregoing is directed to embodiments of the present disclosure, other and further embodiments of the disclosure may be devised without departing from the basic scope thereof, and the scope thereof is determined by the claims that follow.

What is claimed is:

1. A substrate support assembly, comprising:
a substrate support moveable between a raised position, a lowered position below the raised position, and an intermediate position between the raised and lowered positions, the substrate support including a support surface configured to receive a substrate, and a reference surface; and
a lift pin assembly comprising:
a lift plate; and
a plurality of lift pins, each lift pin disposed in a corresponding hole through the substrate support, wherein each lift pin includes:
a first end coupled to a first surface of the lift plate; and
a second end on an opposite end of the lift pin from the first end;
a stop plate positioned below the support surface of the substrate support, the stop plate configured to limit an upward movement of the lift plate; and
a plurality of biasing members coupled to a second surface of the lift plate opposite the first surface of the lift plate;
wherein:
the lift plate is disposed between the plurality of biasing members and the reference surface of the substrate support;
in use, the substrate support assembly transitions between first and second configurations;
in the first configuration, the plurality of biasing members biases the lift plate against the reference surface of the substrate support while the substrate support moves between the lowered position and the intermediate position; and
in the second configuration, the stop plate prevents upward movement of the lift plate while the substrate support moves between the intermediate position and the raised position.

2. The substrate support assembly of claim 1, wherein:
in the first configuration, the lift plate is engaged with the reference surface of the substrate support; and
in the second configuration, the lift plate is not engaged with the reference surface of the substrate support.

3. The substrate support assembly of claim 1, wherein each biasing member is one of a spring, a bellows, or a flexure.

4. The substrate support assembly of claim 1, wherein:
the stop plate is coupled to a base below the lift plate;
the lift plate is moveable to engage the stop plate at a contact point; and
the stop plate includes an adjustment mechanism configured to alter a distance between the base and the contact point.

5. The substrate support assembly of claim 1, wherein the stop plate is coupled to a rod extending from the second surface of the lift plate.

6. The substrate support assembly of claim 5, wherein in the first configuration, the stop plate moves with the lift plate.

7. A substrate support assembly, comprising:
a substrate support moveable between a raised position and a lowered position, and including a support surface configured to receive a substrate, and a reference surface; and
a lift pin assembly comprising:
a lift plate; and
a plurality of lift pins, wherein:
each lift pin of the plurality of lift pins has a first end that is coupled to a first surface of the lift plate and a second end that is on an opposite end of the lift pin from the first end; and
a hole formed through the substrate support is configured to receive a lift pin of the plurality of lift pins;
a stop plate positioned below the support surface of the substrate support, the stop plate configured to limit an upward movement of the lift plate; and
a plurality of biasing members;

wherein:
the lift plate is disposed between the plurality of biasing members and the stop plate;
the plurality of biasing members comprises three or more biasing members; and
the plurality of biasing members is configured to bias the lift plate against the reference surface of the substrate support when the reference surface is positioned below a contact surface of the stop plate, and bias the lift plate against the contact surface of the stop plate when the reference surface is positioned above the contact surface of the stop plate.

8. The substrate support assembly of claim 7, wherein each biasing member is one of a spring, a bellows, or a flexure.

9. The substrate support assembly of claim 7, wherein the second end of each of the plurality of lift pins extends above the support surface of the substrate support when the reference surface of the substrate support is below the contact surface of the stop plate.

10. The substrate support assembly of claim 9, wherein the support surface of the substrate support is positioned above the second end of each of the plurality of lift pins when the reference surface of the substrate support is above the contact surface of the stop plate.

11. The substrate support assembly of claim 10, wherein:
the stop plate includes an adjustment mechanism configured to alter a position of the contact surface of the stop plate.

12. The substrate support assembly of claim 7, wherein the plurality of biasing members is configured to bias the first surface of the lift plate against the contact surface when the reference surface of the substrate support is above the contact surface of the stop plate.

13. The substrate support assembly of claim 7, wherein the plurality of biasing members is configured to bias the first surface of the lift plate against the reference surface of the substrate support when the reference surface is below the contact surface of the stop plate.

14. The substrate support assembly of claim 7, further comprising a sensor positioned on the second end of one of the plurality of lift pins, the sensor including one of a temperature sensor or a strain gauge.

15. A method of manipulating a substrate, comprising:
moving a substrate support upwards from a lowered position to an intermediate position, wherein:
a plurality of lift pins protrudes from a support surface of the substrate support;
the plurality of lift pins is positioned on an upper surface of a lift plate; and
the lift plate and the plurality of lift pins move simultaneously with the substrate support;
contacting the substrate with the plurality of lift pins while the substrate support and the plurality of lift pins move simultaneously;
moving the substrate support upwards from the intermediate position towards a raised position while the plurality of lift pins remains stationary; and
lifting the substrate by the substrate support off the plurality of lift pins while the substrate support moves towards the raised position.

16. The method of claim 15, further comprising using a sensor on at least one lift pin of the plurality of lift pins to detect one of:
a presence of the substrate on the lift pin; or
a temperature of the substrate.

17. The method of claim 15, further comprising moving the substrate support downwards from the raised position towards the intermediate position while the plurality of lift pins remains stationary.

18. The method of claim 17, contacting the substrate with the plurality of lift pins and lifting the substrate off the substrate support by the plurality of lift pins while moving the substrate support downwards towards the intermediate position.

19. The method of claim 18, further comprising moving the substrate support downwards from the intermediate position towards the lowered position, wherein the plurality of lift pins and the substrate support move simultaneously.

20. The method of claim 19, further comprising transferring the substrate from the plurality of lift pins to a carrier while moving the plurality of lift pins simultaneously with the substrate support.

* * * * *